United States Patent [19]
Hembree et al.

[11] Patent Number: 6,040,702
[45] Date of Patent: Mar. 21, 2000

[54] CARRIER AND SYSTEM FOR TESTING BUMPED SEMICONDUCTOR COMPONENTS

[75] Inventors: David R. Hembree, Boise; Warren M. Farnworth, Nampa; Alan G. Wood, Boise; Derek Gochnour, Boise; Salman Akram, Boise, all of Id.

[73] Assignee: Micron Technology, Inc., Boise, Id.

[21] Appl. No.: 08/888,075

[22] Filed: Jul. 3, 1997

[51] Int. Cl.⁷ .................................................. G01R 31/02
[52] U.S. Cl. ........................ 324/755; 324/758; 324/754; 324/765
[58] Field of Search .................................. 324/755, 754, 324/765, 757, 158.1, 762, 758

[56] References Cited

U.S. PATENT DOCUMENTS

| | | | |
|---|---|---|---|
| 4,554,505 | 11/1985 | Zachry | 324/158 F |
| 4,760,335 | 7/1988 | Lindberg | 324/158 F |
| 4,937,653 | 6/1990 | Blonder et al. | 357/68 |
| 5,006,792 | 4/1991 | Malhi et al. | 324/158 F |
| 5,046,239 | 9/1991 | Miller et al. | 29/852 |
| 5,073,117 | 12/1991 | Malhi et al. | 439/71 |
| 5,088,190 | 2/1992 | Malhi et al. | 29/843 |
| 5,123,850 | 6/1992 | Elder et al. | 439/67 |
| 5,196,726 | 3/1993 | Nishiguichi et al. | 257/737 |
| 5,289,631 | 3/1994 | Koopman et al. | 29/840 |
| 5,302,891 | 4/1994 | Wood et al. | 324/158 F |
| 5,322,446 | 6/1994 | Cearley-Cabbiness | 439/73 |
| 5,329,423 | 7/1994 | Scholz | 361/760 |
| 5,341,564 | 8/1994 | Akhavain et al. | 29/832 |
| 5,367,253 | 11/1994 | Wood et al. | 324/158.1 |
| 5,389,873 | 2/1995 | Ishii et al. | 324/158.1 |
| 5,397,245 | 3/1995 | Roebuck et al. | 439/164 |
| 5,408,190 | 4/1995 | Wood et al. | 324/765 |
| 5,414,372 | 5/1995 | Levy | 324/765 |
| 5,420,520 | 5/1995 | Anschel et al. | 324/754 |
| 5,451,165 | 9/1995 | Cearley-Cabbiness | 439/71 |
| 5,453,701 | 9/1995 | Jensen et al. | 324/755 |
| 5,456,404 | 10/1995 | Robinette, Jr. et al. | 228/104 |
| 5,481,205 | 1/1996 | Frye et al. | 324/757 |
| 5,483,174 | 1/1996 | Hembree et al. | 324/765 |
| 5,483,741 | 1/1996 | Akram et al. | 29/846 |

(List continued on next page.)

FOREIGN PATENT DOCUMENTS 3-69131 3/1991 Japan .............................. H01L 21/66

OTHER PUBLICATIONS

EIAJ/Area Array Subcommittee/Memory CSP WG, San Diego, CA, Jun. 1995, technical disclosure bulletin.

Mul, Gary K. et al., "Design Optimization for C4 Die Burn–in and Test Carrier/Socket Assembly (with Statistical Considerations)", *The International Journal of Microcircuits and Electronic Packaging*, vol. 19, No. 2, Second Quarter 1996, pp. 128–137. No month available.

*Chip Scale Review*, published by Tessera Inc., San Jose, CA, May 1997. No month available.

*Primary Examiner*—Josie Ballato
*Assistant Examiner*—Minh Tang
*Attorney, Agent, or Firm*—Stephen A. Gratton

[57] ABSTRACT

A semiconductor carrier and system for testing bumped semiconductor components, such as dice and packages, having contact bumps are provided. The carrier includes a base, an interconnect, and a force applying mechanism. The interconnect includes patterns of contact members adapted to electrically contact the contact bumps. The interconnect can include a substrate having contact members formed as recesses, or as projections, covered with conductive layers. Alternately, the interconnect can be a multi layered tape bonded directly to a base of the carrier. In addition to providing electrical connections, the contact members perform an alignment function by self centering the contact bumps within the contact members. The carrier can also include an alignment member configured to align the components with the interconnect. The system can include the carrier, a socket, and a testing apparatus such as a burn-in board in electrical communication with test circuitry.

31 Claims, 9 Drawing Sheets

U.S. PATENT DOCUMENTS

| | | | |
|---|---|---|---|
| 5,495,179 | 2/1996 | Wood et al. | 324/755 |
| 5,500,605 | 3/1996 | Chang | 324/758 |
| 5,517,125 | 5/1996 | Posedel et al. | 324/755 |
| 5,519,332 | 5/1996 | Wood et al. | 324/755 |
| 5,530,376 | 6/1996 | Lim et al. | 324/765 |
| 5,534,785 | 7/1996 | Yoshiazaki et al. | 324/758 |
| 5,541,525 | 7/1996 | Wood et al. | 324/755 |
| 5,543,725 | 8/1996 | Lim et al. | 324/755 |
| 5,559,444 | 9/1996 | Farnworth et al. | 324/754 |
| 5,578,934 | 11/1996 | Wood et al. | 324/758 |
| 5,581,195 | 12/1996 | Lee et al. | 324/755 |
| 5,592,736 | 1/1997 | Akram et al. | 29/842 |
| 5,604,445 | 2/1997 | Desai et al. | 324/755 |
| 5,607,818 | 3/1997 | Akram et al. | 430/311 |
| 5,625,298 | 4/1997 | Hirano et al. | 324/754 |
| 5,629,630 | 5/1997 | Thompson et al. | 324/754 |
| 5,633,122 | 5/1997 | Tuttle | 430/317 |
| 5,634,267 | 6/1997 | Farnworth et al. | 29/840 |
| 5,678,301 | 10/1997 | Gochnour et al. | |
| 5,739,050 | 4/1998 | Farnworth | |
| 5,756,370 | 5/1998 | Farnworth et al. | |
| 5,783,461 | 7/1998 | Hembree | 438/17 |
| 5,801,452 | 9/1998 | Farnworth et al. | |
| 5,815,000 | 9/1998 | Farnworth et al. | |
| 5,915,755 | 6/1999 | Gochnour et al. | |
| 5,915,977 | 6/1999 | Hembree et al. | |
| 5,931,685 | 8/1999 | Hembree et al. | |
| 5,962,921 | 10/1999 | Farnworth et al. | |

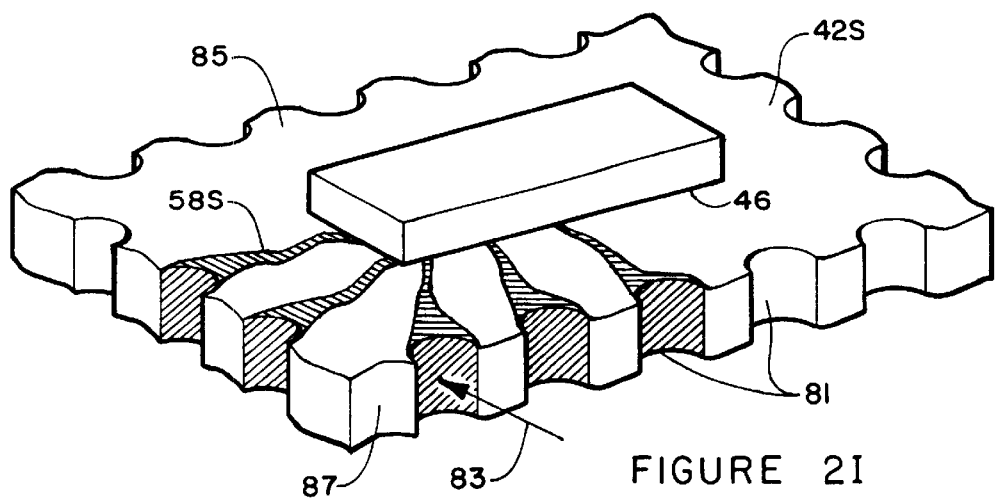
FIGURE 2I
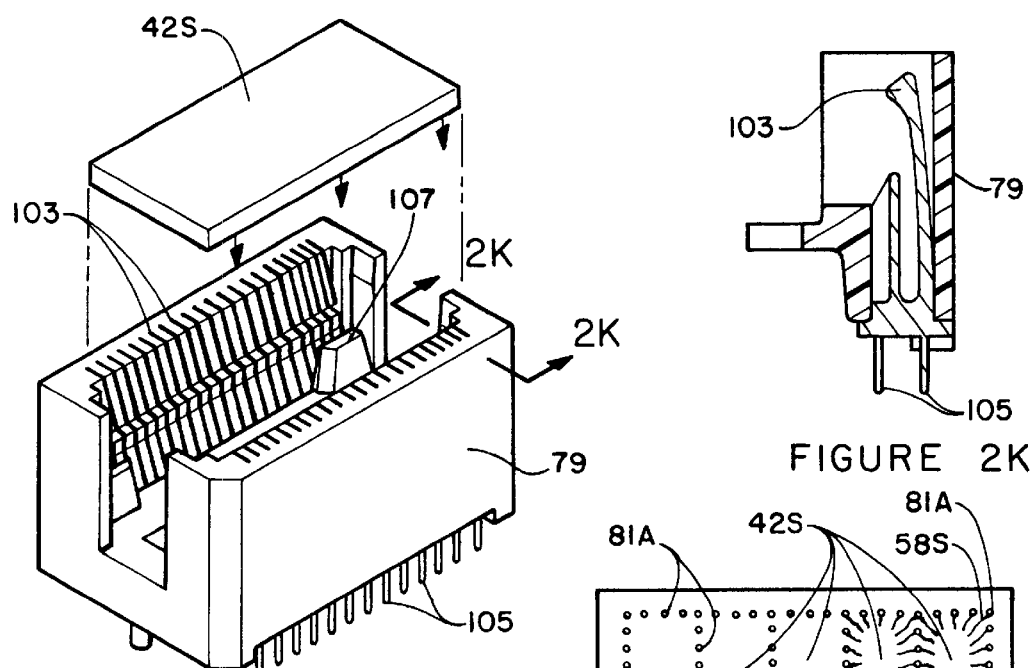
FIGURE 2J
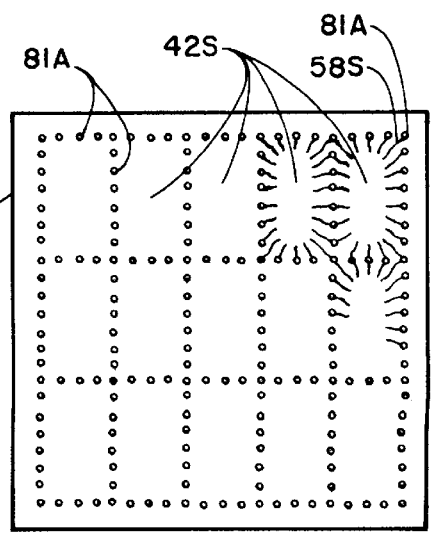
FIGURE 2K
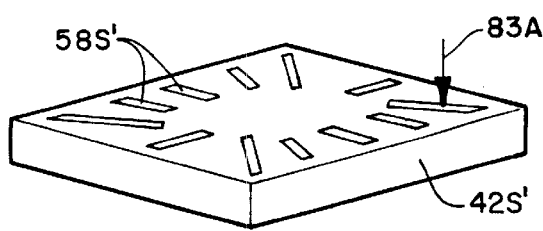
FIGURE 2L
FIGURE 2M

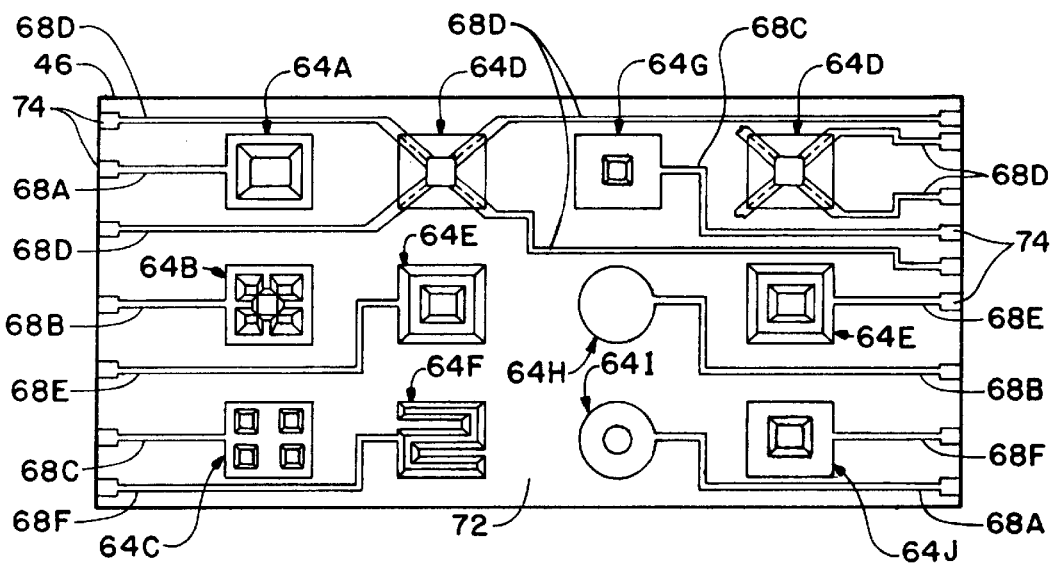
FIGURE 3
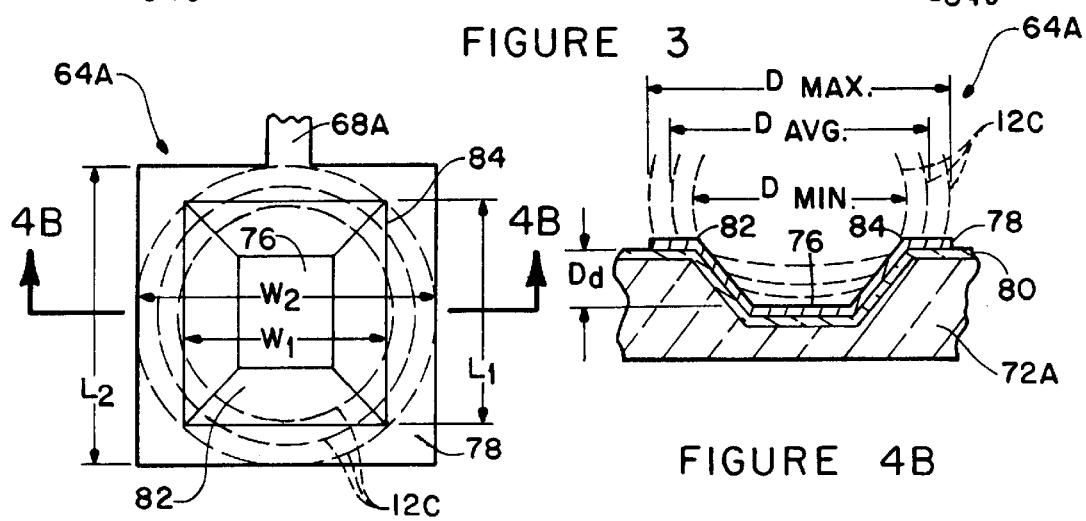
FIGURE 4A
FIGURE 4B
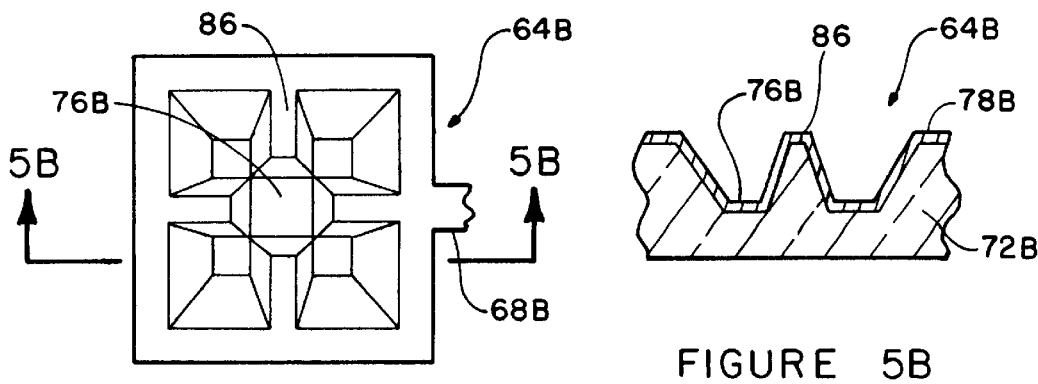
FIGURE 5A
FIGURE 5B

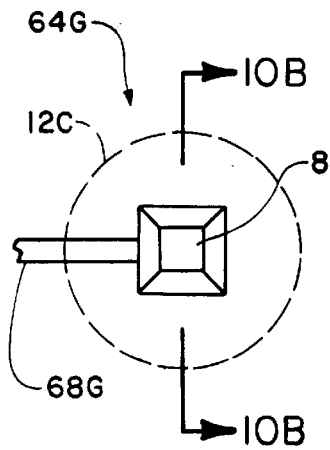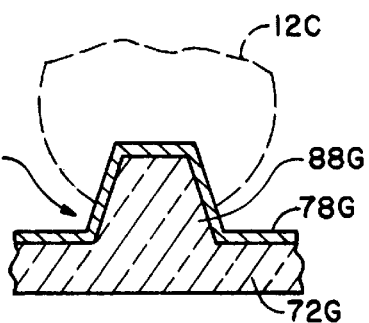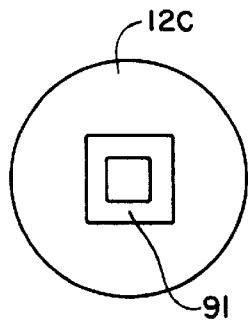
FIGURE 10A  FIGURE 10B  FIGURE 10C
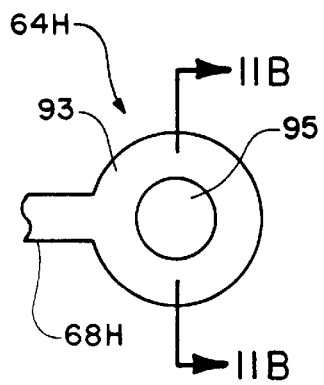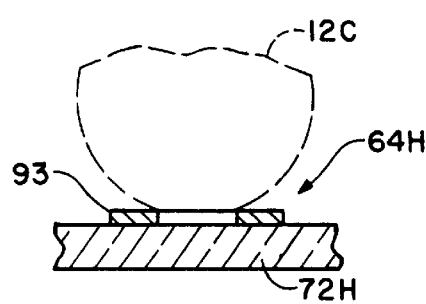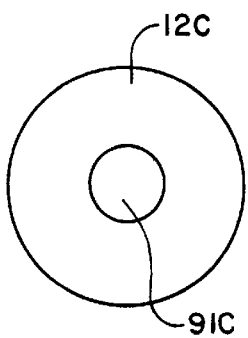
FIGURE 11A  FIGURE 11B  FIGURE 11C
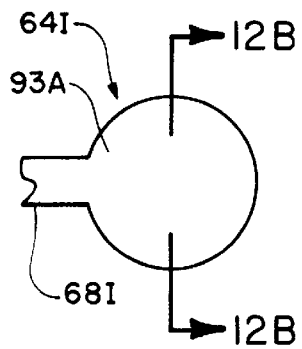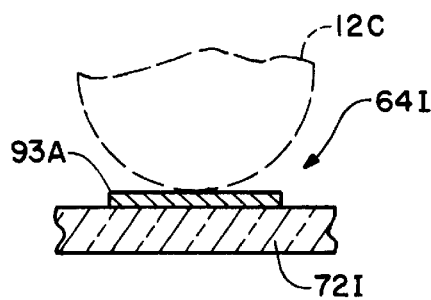
FIGURE 12A  FIGURE 12B

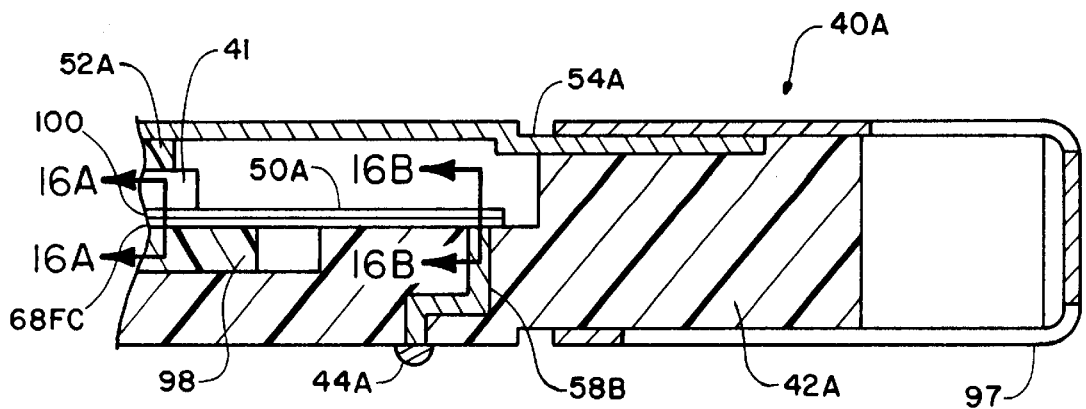
FIGURE 15
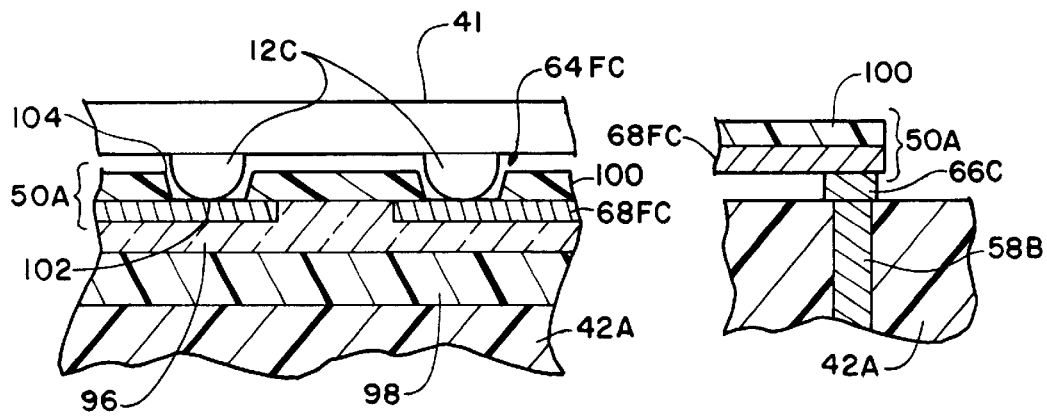
FIGURE 16A
FIGURE 16B
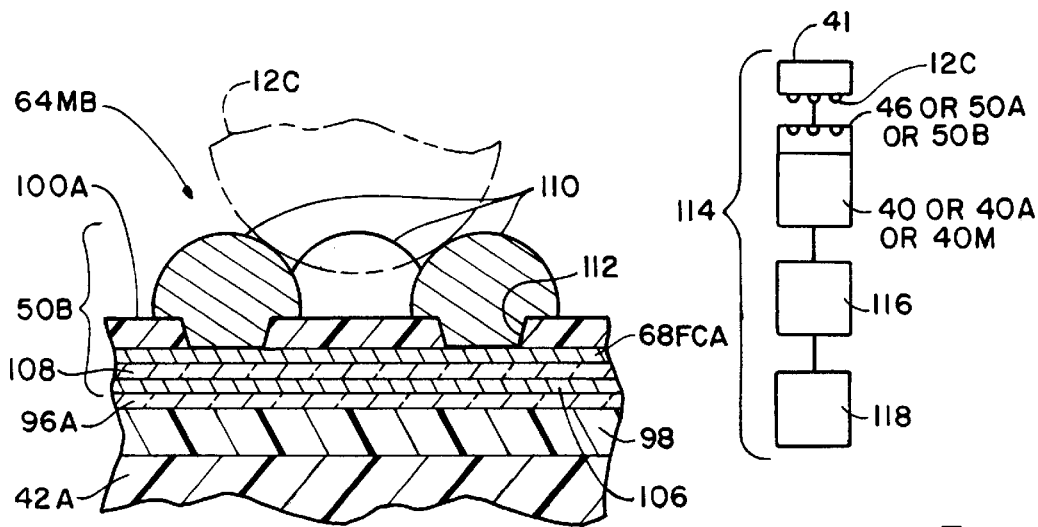
FIGURE 16C
FIGURE 17

6,040,702

CARRIER AND SYSTEM FOR TESTING BUMPED SEMICONDUCTOR COMPONENTS

FIELD OF THE INVENTION

This invention relates generally to semiconductor manufacture, and more particularly to an improved semiconductor carrier and system for temporarily packaging and testing bumped semiconductor components including dice and chip scale packages.

BACKGROUND OF THE INVENTION

Unpackaged semiconductor dice can be burned-in and tested prior to shipment by semiconductor manufacturers. One test procedure involves placing one or more dice in a temporary carrier. The temporary carrier provides a package for handling and electrically connecting the dice to a burn-in board or other testing equipment.

One consideration in designing temporary semiconductor carriers is the size and outline thereof. Preferably a temporary carrier has an outline, or footprint, in the x-y plane that is as small as possible. In addition, the height of a temporary carrier in the "z" direction is preferably as low as possible. With a small outline and low height, a temporary carrier can be handled by standard test equipment used for testing conventional semiconductor packages.

Another consideration in the design of temporary carriers is the ability to transmit electronic test signals to the components under test, at high speeds and with low parasitics. For example, test speeds of 500 mHz or greater are anticipated in future memory devices. In addition, the input/output capability of a temporary carrier is preferably high. This allows test procedures to be performed on components having a large number of input/output paths.

Yet another consideration in the design of temporary carriers is the ability to assemble and disassemble the temporary carriers in a production environment. Preferably a temporary carrier has the capability of being easily assembled, and reliable electrical connections made without damaging the components being tested. In addition, a temporary carrier must be capable of disassembly without damaging the components. Solder contact bumps on unpackaged dice are particularly susceptible to damage and often require a solder reflow step in order to return the bump to a shape suitable for bonding.

Another recent development in semiconductor manufacture involves packaging bare dice in "chip scale" packages. Chip scale packages are also referred to as "chip size" packages, and the dice are referred to as being "minimally packaged". Chip scale packages can also be constructed in "uncased" or "cased" configurations. Uncased chip scale packages have a peripheral outline that is about the same as an unpackaged die. Cased chip scale packages have a peripheral outline that is slightly larger that an unpackaged die.

Typically, a chip scale package includes a substrate formed of plastic, ceramic, or other electrically insulating material bonded to the face of the die. The substrate includes the external contacts for making outside electrical connections to the chip scale package. For example, the external contacts for a chip scale package can comprise contact bumps arranged in a ball grid array (BGA). Alternately the external contacts can be pads arranged in a land grid array (LGA), or pins in a pin grid array (PGA).

One consideration in temporarily packaging chip scale packages for test and burn-in, is making temporary electrical connections with dense arrays of external contacts. In particular, the external contacts can vary in size between different chip scale packages, and also between external contacts on the same chip scale package. In addition, the external contacts can vary in their location along x, y and z directions. Still further, the location of the external contacts with respect to the outline of the chip scale package can also vary. Typically, "cased" chip scale packages are formed with a standard x-y-z convention which can aid in the alignment process. However, "uncased" chip scale packages can vary in peripheral size and in the locations of the external contacts.

In view of the foregoing, improved carriers for testing bumped semiconductor components including unpackaged dice, and chip scale packages are needed. In particular carriers which can be used to test either dice or packages, using standard testing equipment are needed. In addition, improved methods for aligning and electrically contacting external contacts on temporarily packaged dice and chip scale packages are needed.

SUMMARY OF THE INVENTION

In accordance with the present invention, an improved semiconductor carrier and system are provided. The carrier and system are configured for temporarily packaging and testing bumped semiconductor components, such as bare dice, and chip scale packages, having external contacts in the form of contact bumps.

The semiconductor carrier, broadly stated, comprises: a base for retaining one or more semiconductor components; an interconnect mounted to the base including contact members for electrically contacting the semiconductor components; and a force applying mechanism for biasing the components against the interconnect.

The base can include a separate substrate attached thereto, having dense array external contacts, such as metal balls in a ball grid array (BGA). The dense array external contacts permit a high input/output capability through a mating test apparatus, such as a burn-in board. The base can also be configured for mating electrical engagement with a socket connectable to a test apparatus. In this embodiment the base can comprise ceramic or other insulating material having plated indentations configured to electrically contact spring loaded connectors on the socket.

The semiconductor carrier can also include an alignment member having a peripheral opening configured to align the semiconductor components with the interconnect. The alignment member can comprise an etched plate, or alternately a deposited and patterned layer of resist. In addition, alignment can be performed in stages with a coarse alignment member and a separate fine alignment member. In the plate embodiment, the alignment member can be configured to protect bonded electrical connections (e.g., wire bonds, solder bonds) between the interconnect and base.

The interconnect includes a substrate, such as silicon, ceramic, or FR-4, having integrally formed contact members. The contact members, in addition to electrically contacting the contact bumps on the semiconductor components, can also perform an alignment function by self centering the component to the interconnect. In illustrative embodiments, the contact members comprise: recesses covered with conductive layers; recesses having internal blades; projections configured to retain individual contact bumps; projections configured to electrically engage multiple contact bumps; projections configured to penetrate individual contact bumps; and flat pads configured to contact individual contact bumps.

One or more contact members on the interconnect can have a different configuration to allow orientation verification. In particular, a contact member can be a "Pin 1" indicator, configured to form distinctive "witness marks" on a particular contact bump. In other alternate embodiments, the contact members can be formed on a multi layered flex circuit, similar to TAB tape. In these embodiments the flex circuit can be directly bonded to the conductors on the base. In addition, the flex circuit can include a voltage or ground plane for matching an impedance of the conductors on the flex circuit to other system components.

The force applying mechanism can include one or more biasing members, such as springs or compressible elastomeric pads, for biasing the semiconductor components against the interconnect. In addition, a biasing member can be mounted between the interconnect and base to provide additional compliancy and compressibility for the contact members.

BRIEF DESCRIPTION OF THE DRAWINGS

FIG. 2I is a schematic perspective view of an alternate embodiment base for the carrier shown in FIG. 2A;

FIG. 2J is a schematic perspective view of a socket configured for mating electrical engagement with the alternate embodiment base of FIG. 2I;

FIG. 2K is a cross sectional view taken along section line 2K—2K of FIG. 2J;

FIG. 2L is a schematic perspective view of another alternate embodiment base for the carrier shown in FIG. 2A;

FIG. 2M is a plan view of a wafer containing a plurality of alternate embodiment bases during a fabrication process and prior to singulation;

FIG. 3 is a schematic plan view of the interconnect for the carrier illustrating different contact member embodiments for the interconnect;

FIG. 4A is an enlarged plan view of a recessed contact member comprising a recess covered with a conductive layer;

FIG. 4B is a cross sectional view, taken along section line 4B—4B of FIG. 4A;

FIG. 5A is an enlarged plan view of an alternate embodiment contact member comprising a recess with penetrating blades;

FIG. 5B is a cross sectional view, taken along section line 5B—5B of FIG. 5A;

FIG. 10A is an enlarged plan view of an alternate embodiment contact member comprising a projection configured to penetrate the contact bumps;

FIG. 10B is a cross sectional view, taken along section line 10B—10B of FIG. 10A;

FIG. 10C is a bottom view of a contact bump subsequent to contact with the contact member of FIG. 10A showing a witness mark on the contact bump;

FIG. 11A is an enlarged plan view of an alternate embodiment contact member comprising a flat pad with a recess;

FIG. 11B is a cross sectional view, taken along section line 11B—11B of FIG. 11A;

FIG. 11C is a bottom view of a contact bump subsequent to contact with the contact member of FIG. 11A showing a witness mark on the contact bump;

FIG. 12A is an enlarged plan view of an alternate embodiment contact member comprising a flat pad;

FIG. 12B is a cross sectional view taken along section line 12B—12B of FIG. 12A;

FIG. 15 is an enlarged cross sectional view of an alternate embodiment carrier including a flex circuit interconnect;

FIG. 16A is an enlarged cross sectional view, taken along section line 16A—16A of FIG. 15, illustrating contact members for the alternate embodiment carrier;

FIG. 16B is an enlarged cross sectional view, taken along section line 16B—16B of FIG. 15, illustrating a bonded connection of the flex circuit interconnect for the alternate embodiment carrier;

FIG. 16C is an enlarged cross sectional view of an alternate embodiment impedance matched interconnect for the alternate embodiment carrier shown in FIG. 15; and FIG. 17 is a block diagram of a system constructed in accordance with the invention.

DETAILED DESCRIPTION OF THE PREFERRED EMBODIMENTS

Figure 1A:
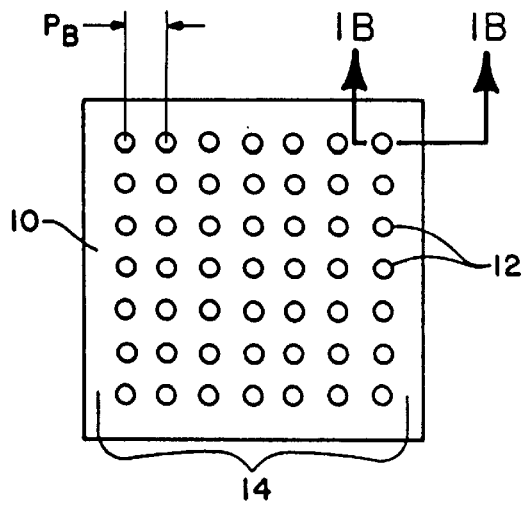
FIG. 1A is a plan view of a prior art bumped semiconductor die including contact bumps arranged in a ball grid array (BGA)
Figure 1B:
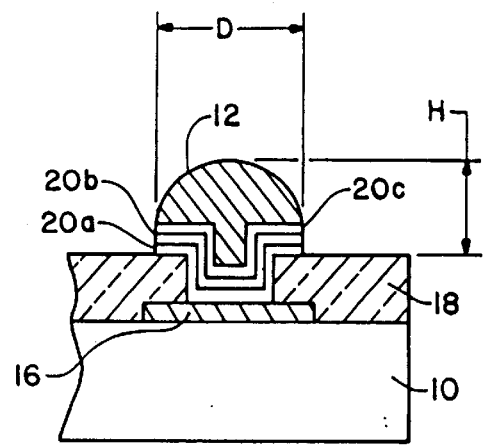
FIG. 1B is a cross sectional view of a prior art contact bump taken along section line 1B—1B of FIG. 1A.

Referring to FIGS. 1A and 1B, a bumped semiconductor die 10 is shown. The die 10 includes a pattern of contact bumps 12 arranged in a ball grid array (BGA) 14. As shown in FIG. 1B, the die 10 also includes a passivation layer 18 and contacts 16 for the contact bumps 12. The contacts 16 are in electrical communication with the semiconductor devices and integrated circuits formed on the die 10.

Each contact bump 12 can be formed on a corresponding contact 16. In addition, each contact bump 12 can include a stack of underlying layers 20a–c. By way of example, layer 20a can be an adherence layer (e.g., Cr), layer 20b can be a solderable layer (e.g., Cu) and layer 20c can be a flash layer (e.g., Au). The contact bumps 12 can be formed by processes that are known in the art such as ball limiting metallurgy (ELM). Typically, the contact bumps 12 are formed of a lead/tin solder (e.g., 63Pb/37Sn, 95Pb/5Sn).

As shown in FIG. 1B, each contact bump 12 can be generally hemispherical, convex, or dome-shaped, with an outside diameter "D" and a height of "H". In general, the diameter "D" of the contact bumps 12 will be different for different bumps. Also the height "H" will be different causing non-planarity of the ball grid array 14 (FIG. 1A) in the z-direction. Still further, the pitch "$P_B$" (FIG. 1A) and location of the contact bumps 12 can vary. These dimensional variations will occur between the bumps on the same die and between the bumps on different dice, particularly different types of dice.

Figure 1C:
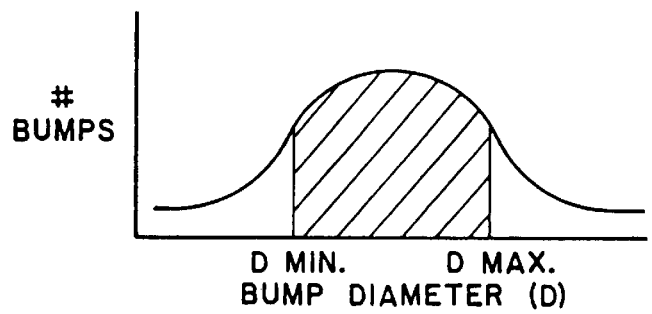
FIG. 1C is a graph illustrating a sampling of a prior art bumped semiconductor dice wherein an average minimum bump diameter ($D_{MIN}$) and an average maximum bump diameter ($D_{MAX}$) are ascertained.

As shown in FIG. 1C, measurement and statistical analysis techniques can be used to ascertain a range of bump diameters "D" for a particular type of die. FIG. 1C shows a simple analysis wherein an average minimum bump diameter ($D_{MIN}$) and an average maximum bump diameter ($D_{MAX}$) are ascertained. A similar analysis can be performed to ascertain an average minimum height ($H_{MIN}$) and an average maximum height ($H_{MAX}$). By determining a statistical average size range for the bumps, an interconnect can be constructed in accordance with the invention to accommodate a range of bumps sizes.

Figure 1D:
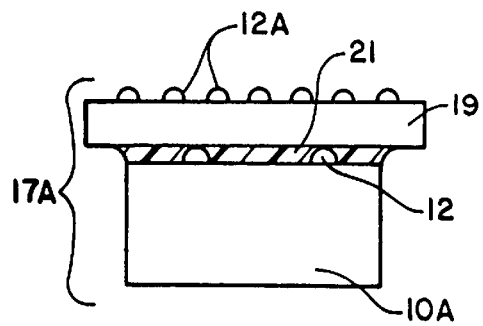
FIG. 1D is a schematic cross sectional view of a prior art "uncased" chip scale package having contact bumps.
Figure 1E:
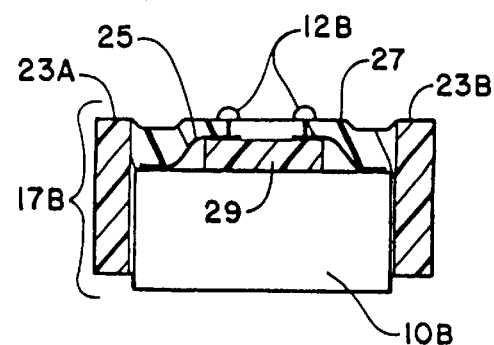
FIG. 1E is a schematic cross sectional view of a prior art "cased" chip scale package having contact bumps.

Referring to FIGS. 1D and 1E, a die can also be contained within a chip scale package 17A (FIG. 1D) or a chip scale package 17B (FIG. 1E). In FIG. 1D, the chip scale package 17A comprises a semiconductor die 10A, and a BGA substrate 19 bonded to the face of the die 10A with an adhesive layer 21. The BGA substrate 19 includes contact bumps 12A in electrical communication with contact bumps 12 on the die 10A. The contact bumps 12A on the BGA substrate 19 are substantially equivalent to the contact bumps 12 (FIG. 1B) previously described.

In FIG. 1E, the chip scale package 17B includes a semiconductor die 10B, and protective members 23A, 23B bonded to either side of the die 10B. In addition, the chip scale package 17B includes contact bumps 12B in electrical communication with the die bond pads via leads 25. An encapsulant 27 and an elastomeric pad 29 electrically isolate the leads 25 and bumps 12B. As is apparent, these configurations are merely exemplary and other chip scale package configurations are common in the art.

Figure 2A:
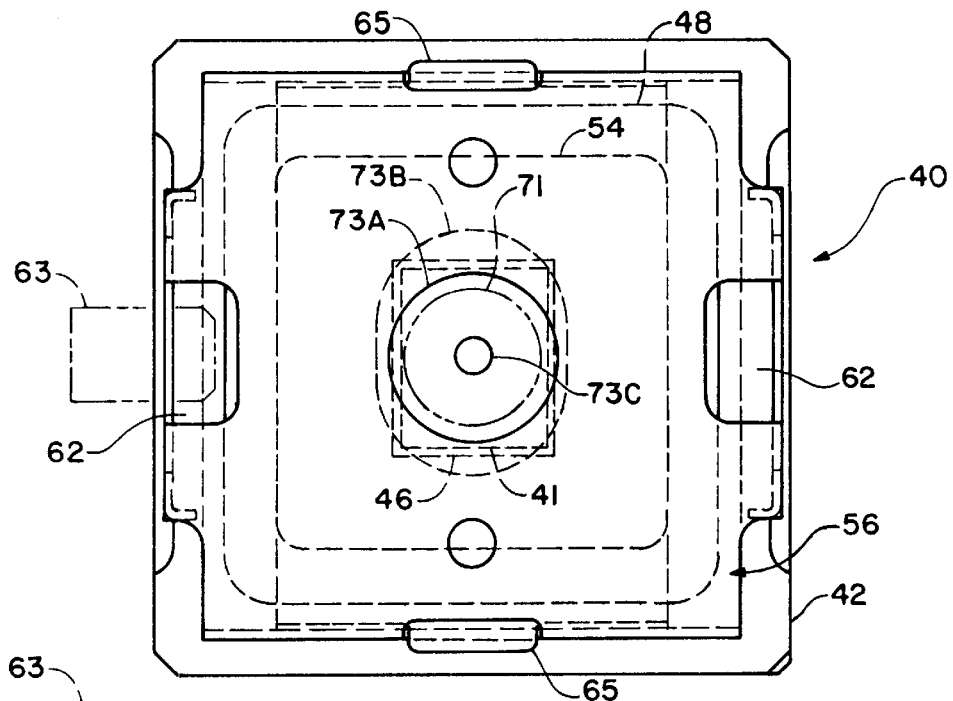
FIG. 2A is an enlarged plan view of an assembled semiconductor carrier constructed in accordance with the invention.
Figure 2B:
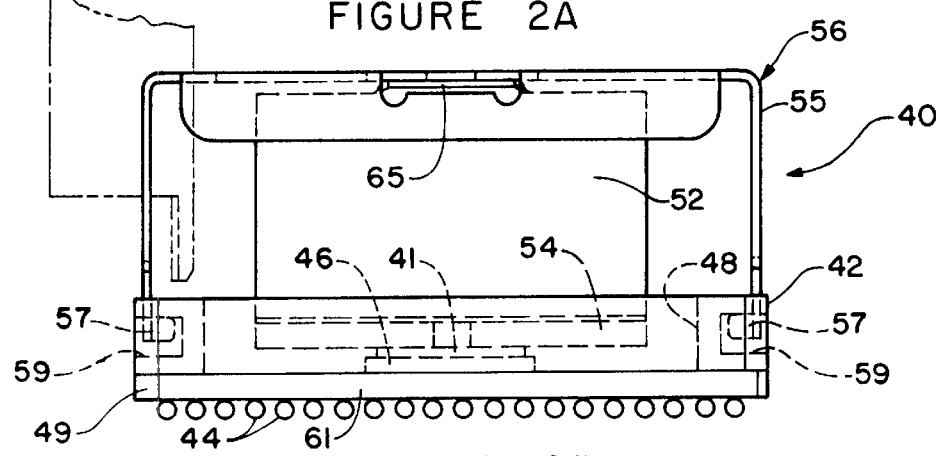
FIG. 2B is a front elevation view of FIG. 2A.

Referring to FIGS. 2A–2H, a semiconductor carrier 40 configured to temporarily package a bumped semiconductor component 41 for testing is shown. The bumped semiconductor component 41 can be a die (e.g. die 10—FIG. 1A) or a chip scale package (e.g., chip scale packages 17A—FIG. 1D, 17B—FIG. 1E). The carrier 40, broadly stated, includes: a base 42 (FIG. 2A), an interconnect 46 (FIG. 2C), a BGA substrate 61 (FIG. 2B), and a force applying mechanism 56 (FIG. 2B).

Figure 2C:
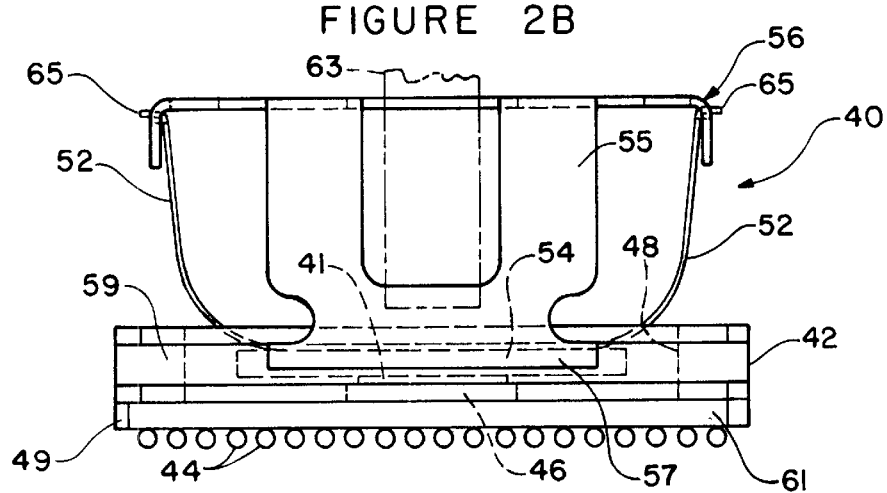
FIG. 2C is a side elevation view of FIG. 2A.

In the embodiment illustrated in FIGS. 2A–2C, the base 42 comprises a generally rectangular-shaped, open-ended, frame-like member formed of metal, molded plastic, or ceramic. The base 42 includes parallel spaced latching grooves 59 formed on either side thereof, for removably attaching the force applying mechanism 56 to the base 42. In addition, the base 42 includes a first recess 48 for mounting the interconnect 46, and a second recess 49 for mounting the BGA substrate 61.

Figure 2D:
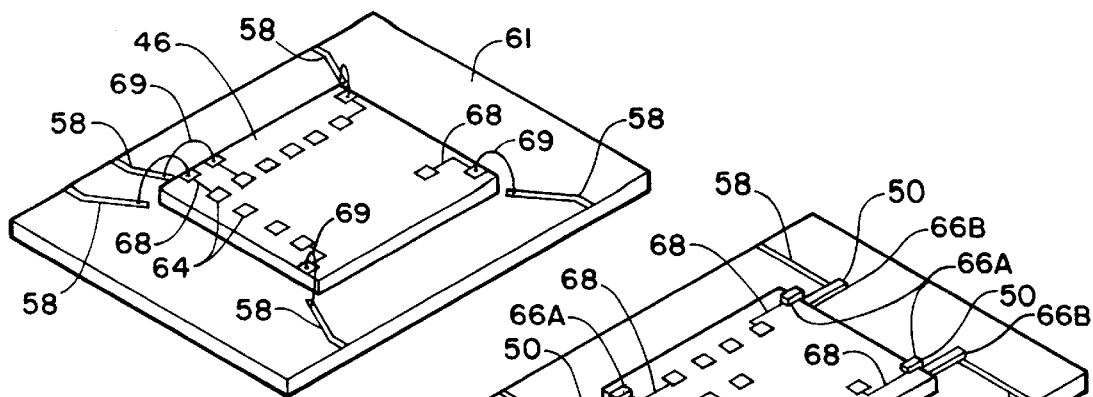
FIG. 2D is a schematic perspective view illustrating wire bonded connections between an interconnect and a BGA substrate of the carrier.

The interconnect 46 is configured to establish temporary electrical communication with contact bumps 12C (FIG. 2F) on the semiconductor component 41. The contact bumps 12C on the semiconductor component 41 are formed as previously described for bumps 12, 12A and 12B. As shown in FIG. 2D, the interconnect 46 includes patterns of contact members 64 for electrically contacting the contact bumps 12C (FIG. 2F). The contact members 64 on the interconnect 46 are in electrical communication with patterns of conductors 58. The patterns of conductors 58 provide electrical paths to and from the contact members 64. Further details of the interconnect 46 will be hereinafter described.

In order to provide electrical connections from the outside for testing, the interconnect 46 is in electrical communication with the BGA substrate 61. The BGA substrate 61 comprises an insulating material such as ceramic, FR-4, glass filled resin, or printed circuit board material, having external contacts 44 (FIG. 2B) formed thereon. In this embodiment, the external contacts 44 comprise metal balls arranged in a ball grid array (BGA). The BGA substrate 61 can be manufactured separately, and then attached to the second recess 49 in the base 42 using an adhesive (not shown).

As will be further explained, the external contacts 44 (FIG. 2B) on the BGA substrate 61 are adapted for mating electrical engagement with a testing apparatus. Preferably the external contacts 44 comprise a hard metal able to resist wear and deformation. A process for forming hard metal external contacts is described in U.S. Pat. No. 5,783,461 entitled "Temporary Semiconductor Package Having Hard-Metal, Dense Array Ball Contacts And Method Of Fabrication", incorporated herein by reference.

As shown in FIG. 2D, the BGA substrate 61 also includes patterns of conductors 58 in electrical communication with the external contacts 44. The conductors 58 are formed on a first side of the BGA substrate 61 (i.e., face) and the external contacts 44 are formed on a second opposing side thereof (i.e., backside). Metal filled vias (not shown) can be formed in the BGA substrate 61 for interconnecting the conductors 58 and external contacts 44.

As also shown in FIG. 2D, wires 69 can be wire bonded to the conductors 58 on the BGA substrate 61 and to the conductors 68 on the interconnect 46 to form electrical paths therebetween. Conventional wire bonding apparatus can be used to form the wire bonds.

Figure 2E:
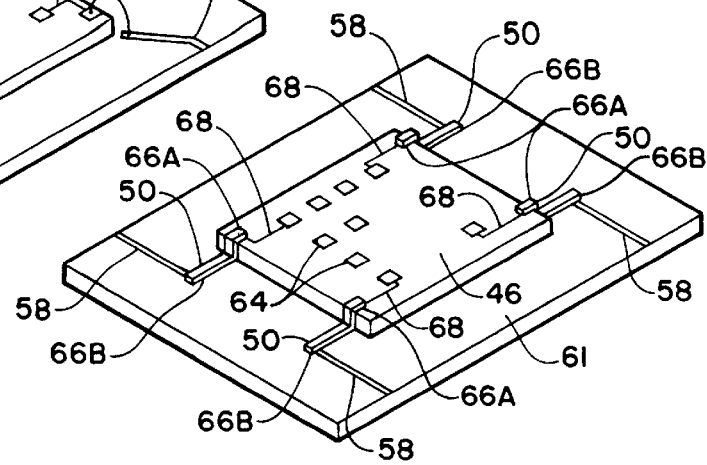
FIG. 2E is a schematic perspective view illustrating flex circuit connections between the interconnect and BGA substrate of the carrier.
Figure 2F:
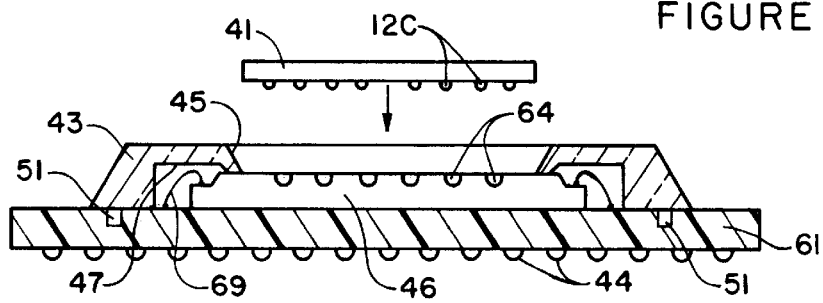
FIG. 2F is a schematic cross sectional view of an alignment member for the carrier shown mounted to the BGA substrate.

Alternately, as shown in FIG. 2E, a multi layered flex circuit 50 can be bonded to the conductors 58 on the BGA substrate 61 and to the conductors 68 on the interconnect 46. The flex circuit 50 can be similar to TAB tape, such as "ASMAT" manufactured by Nitto Denko. As will be further described, the flex circuit 50 comprises an insulating film, such as polyimide, having patterns of conductors formed thereon. The conductors on the flex circuit 50 include bonded connections 66A and 66B at opposing ends. Bonded connections 66A are bonded to the conductors 68 on the interconnect 46. Bonded connections 66B are bonded to the conductors 58 on the BGA substrate 61. The bonded connections 66A, 66B can comprise solder bumps, or other members, formed on the conductors of the flex circuit 50. For example, "ASMAT" can include solder bumps formed in vias through a polyimide insulating film. The solder bumps are in electrical communication with patterns of conductors laminated to the insulating film. The bonded connections 66A, 66B permit high speed testing with low parasitics. Bonding of the bonded connections 66A, 66B can be accomplished using heat, pressure or ultrasound techniques. As will be further explained, the flex circuit 50 can also include a voltage or ground plane, that permits the conductors on the flex circuit 50 to have an impedance that matches other system components.

Referring again to FIGS. 2B and 2C, the force applying member 56 for the carrier 40 includes a lid 54, a leaf spring 52, and a bridge clamp 55. The lid 54 is a generally rectangular shaped member configured for direct physical contact with the semiconductor component 41. Preferably the lid 54 is formed of a heat conductive material, such as metal, or a metal filled polymer (e.g., silver epoxy) to dissipate heat during testing of the component 41.

As shown in FIG. 2C, the leaf spring 52 is adapted to bias the semiconductor component 41 against the interconnect 46. Preferably the leaf spring 52 comprises spring steel, or other material, sized and shaped to exert a predetermined biasing force on the component 41. As also shown in FIG. 2C, the leaf spring 52 includes retaining tabs 65 formed on opposite ends thereof. The retaining tabs 65 removably attach to slots in the bridge clamp 55.

As shown in FIG. 2B, the bridge clamp 55 includes clip portions 57 adapted for mating engagement with the latching grooves 59 in the base 42. In addition, the bridge clamp 55 includes openings 62 (FIG. 2A) on either side for providing access for actuator members 63 (FIG. 2A). The actuator members 63 can be components of a manual or automated apparatus (not shown) adapted to assemble and disassemble the carrier 40. Such an assembly/disassembly apparatus is more fully described in U.S. Pat. No. 5,634,267 entitled "Method For Manufacturing Known Good Semiconductor Die", incorporated herein by reference.

In general, the actuator members 63 are adapted to manipulate the bridge clamp 55, and attach the clip portions 57 thereof to the latching grooves 59 (FIG. 2B) in the base 42. One type of actuator member is described in U.S. Pat. No. 5,739,050, entitled "Method And Apparatus For Assembling A Temporary Carrier For a Semiconductor Die", incorporated herein by reference.

The assembly/disassembly apparatus can also include a vacuum quill 71 (FIG. 2A) operable in concert with the actuator members 63. The vacuum quill 71 is adapted to manipulate the semiconductor component 41 during assembly of the carrier 40. As shown in FIG. 2A, the bridge clamp 55, leaf spring 52, and lid 54 include through openings 73A, 73B, 73C respectively for the vacuum quill 71. The construction and function of the different components of the carrier 40 will become more apparent as the description proceeds.

Figure 2G:
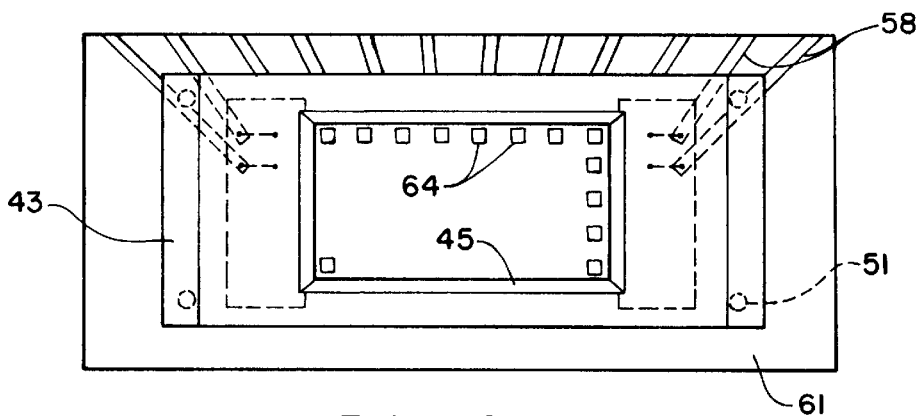
FIG. 2G is a plan view of the alignment member and BGA substrate.
Figure 2H:
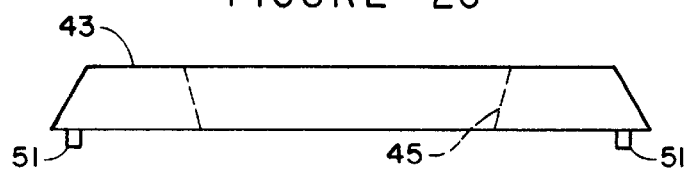
FIG. 2H is a side elevation view of the alignment member.

Referring to FIGS. 2F–2H, an alignment member 43 for the carrier 40 is illustrated. The alignment member 43 is adapted to align the contact bumps 12C on the semiconductor component 41 with the contact members 64 on the interconnect 46. As the alignment member 43 is an optional component of the carrier 40, it is not shown in FIGS. 2A–2E. If the carrier 40 is not provided with the alignment member 43, alignment can be accomplished using optical alignment as described in previously incorporated U.S. Pat. No. 5,634,267.

The alignment member 43 can be formed of silicon, ceramic, plastic, or FR-4. The alignment member 43 includes an alignment opening 45 having a peripheral outline that is slightly larger than a peripheral outline of the semiconductor component 41. As shown in FIGS. 2F and 2G, the alignment opening 45 includes sloped sidewalls, adapted to contact the outside edges of the component 41, to guide the component 41 onto the interconnect 46. The alignment member 43 can also include pins 51, adapted for mating engagement with corresponding pockets in the BGA substrate 61. If desired, an adhesive can be used to secure the alignment member 43 to the BGA substrate 61. In addition, the alignment member 43 can include recesses 47 shaped to enclose and protect the bond wires 69, and the bonded connections between the interconnect 46 and BGA substrate 61. If the interconnect 46 is bonded to the BGA substrate 61 with flex circuit 50 (FIG. 2E), the recesses 47 can be configured to enclose and protect the flex circuit 50 and bonded connections 66A, 66B (FIG. 2E).

With the alignment member 43 formed of silicon, an anisotropic etch using KOH or other etchant can be performed to form the alignment opening. In addition, electrically insulating layers (e.g., $SiO_2$, $Si_3N_4$, polyimide etc.) can be formed on the alignment member 43 as required, using a deposition or growth process, to insulate the alignment member 43 or portions thereof. A suitable method for forming the alignment member 43 is described in U.S. Pat. No. 5,559,444, entitled "Method And Apparatus For Testing Unpackaged Semiconductor Dice", incorporated herein by reference.

Referring to FIGS. 2I–2M, an alternate embodiment base 42S for the carrier 40 is illustrated. The base 42S is configured for mating electrical engagement with a socket 79 (FIG. 2J). Preferably the base 42S is formed of an electrically insulating material such as ceramic. Other suitable materials include silicon, germanium, photomachineable glass, and FR-4. The base 42S includes patterns of conductors 58S on a face surface 85 thereof, and indentations 81 on edge surfaces 87 thereof. Each conductor 58S has an associated indentation 81. The indentations 81 are configured for electrical contact by the socket 79 (FIG. 2J) as indicated by electrical contact arrow 83 (FIG. 2I). The interconnect 46 mounts to the base 42S in electrical communication with the conductors 58S using bond wires (not shown), or flex circuit (not shown), substantially as previously described.

The conductors 58S on the base 42S can be formed of highly conductive metals such as aluminum, iridium, copper, gold, tungsten, tantalum, molybdenum or alloys of these metals. The conductors 58S can be formed using a thick film metallization process such as electrodeposition, stenciling or screen printing. The conductors can also be formed using a thin film metallization process such as photopatterning and etching a blanket deposited metal layer. In FIG. 2I, the conductors 58S have tapered widths that enlarge as the indentations 81 are approached.

One method for forming the conductors 58S and indentations 81 is with a wafer level fabrication process. As shown in FIG. 2M, a wafer 89 can include multiple bases 42S, each having patterns of conductors 58S, and associated patterns of indentation openings 81A. Singulation of the wafer 89 through the openings 81A, forms the individual bases 42S. The openings 81A can comprise linear through perforations, similar to the perforations in soda crackers. Singulation of the wafer 89 can be by breaking along the openings 81A.

When the patterns of conductors 58S are formed on the wafer 89, the metal which forms the conductors 58S can also be deposited on the inside diameters of the openings 81A. With a thick film deposition process, the metal will flow into the openings 81A and coat the walls thereof.

Alternately, singulation can be by saw cutting, or by shearing. During singulation, the openings 81A are split to form the metallized indentations 81 along the edges 87 of the bases 42S. In FIG. 2I, the indentations 81 are enlarged for illustrative purposes. However, in actual practice the indentations 81 can have a width of only several mils or less.

As shown in FIGS. 2J and 2K, the socket 79 is configured to receive the base 42S from above. In FIG. 2J only the base 42S is illustrated for simplicity. However, as the base 42S is a component of the carrier 40, the socket 79 actually receives the entire carrier 40 (FIG. 2A). The socket 79 includes rows of electrical connectors 103 that electrically contact the indentations 81 in the base 42S. The electrical connectors 103 are formed of a flexible material such as beryllium copper, or "PALLINEY 7" available from J. M. Ney Company of Hartford, Conn. The electrical connectors 103 are shaped to flex upon insertion of the base 42S and then to seat within the indentations 81. The socket 79 includes stop members 107 (FIG. 2J) configured to limit the axially downward movement of the base 42S. In addition, the electrical connectors 103 include terminal portions formed as external pins 105. The external pins 105 are configured for electrical connection to a test apparatus, such as a burn-in board. In FIG. 2L, a base 42S' equivalent to base 42S, includes patterns of conductors 58S' configured for electrical contact from above as indicated by electrical contact arrow 83A.

Referring to FIG. 3, the interconnect 46 is illustrated separately. The interconnect 46 includes patterns of contact members 64A–I formed on a substrate 72. Each contact member 64A–I is adapted to make an electrical connection with a contact bump 12C (FIG. 2F) on the semiconductor component 41 (FIG. 2F). In addition, each contact member 64A–I is adapted to self center the contact bump 12C with respect to the contact members 64A–I to provide further alignment of the component 41 with respect to the interconnect 46.

In FIG. 3, different embodiments of the contact members 64A–I are illustrated on the same interconnect 46. In actual practice an interconnect 46 will contain only one type of contact member 64A–I. However, a verification contact member can be used at a specified location on the interconnect 46 to allow orientation verification for the component 41 (i.e., pin 1 indicator). The verification contact member can be configured to imprint a particular contact bump 12C with a distinctive witness mark. In addition, alignment fiducials (not shown) can be printed or otherwise formed on the interconnect 46 to facilitate alignment and orientation verification in an optical alignment system.

Each contact member 64A–I has an associated conductor 68A–I. In addition, each conductor 68A–F includes an associated bond pad 74. In the assembled carrier 40, the bond pads 74 provide bonding sites for the bond wires 69 (FIG. 2D), or for the bonded connections 66A (FIG. 2E) with the flex circuit 50 (FIG. 2E).

Referring to FIGS. 4A and 4B, contact member 64A is illustrated. The contact member 64A includes a recess 76 formed in a substrate 72A, and a conductive layer 78 covering the recess 76. The conductive layer 78 is in electrical communication with a conductor 68A formed on the substrate 72A. In addition, an insulating layer 80 (FIG. 4B) is formed on the substrate 72A to electrically isolate the conductive layer 78 and conductor 68A from the bulk of the substrate 72A.

The substrate 72A can be formed of a material having a coefficient of thermal expansion (CTE) that matches, or closely approximates, the CTE of semiconductor dice. Suitable materials include silicon, germanium, ceramic, photomachineable glass and FR-4. The recess 76 can be etched, laser drilled, photo machined, or otherwise formed in the substrate 72A. In addition, the recess 76 can have a desired shape such as square, rectangular, elongated rectangular, circular or oval.

With the substrate 72A formed of silicon, the recess 76 can be formed by forming a mask (not shown) on the substrate 72A and then etching with a wet or dry etchant. The etch process can be either anisotropic or isotropic. With an anisotropic etch process the recess 76A will have straight sidewalls 82, sloped at an angle of about 55° with respect to the surface of the substrate 72A, substantially as shown in FIG. 4B. One suitable etchant for performing an anisotropic etch of a silicon substrate 72A is a solution of $KOH:H_2O$. With an isotropic etch process, the recess 76 will have curved sidewalls (not shown). One suitable etchant for performing an isotropic etch of a silicon substrate 72A is a mixture of HF, $HNO_3$ and $H_2O$.

Also, with the substrate 72A formed of silicon, the insulating layer 80 (FIG. 4B) can be a grown or deposited layer of $SiO_2$. With the substrate 72A formed of an insulating material such as ceramic or glass, the insulating layer 80 is not required.

The contact member 64A includes a peripheral edge 84 configured to break through any native oxide covering the contact bumps 12C. The peripheral edge 84 is formed by the edge of the recess 76 and is covered by the conductive layer 78. The recess 76 and peripheral edge 84 are sized and shaped to compensate for large variations in the diameter (D), height (H), volume (V), shape, and planarity of the bumps 12C. In particular, the width "W1" (FIG. 4A) and length "L1" (FIG. 4A) of the peripheral edge 84 can be selected such that a bump 12C with an average minimum bump diameter ($D_{MIN}$) can be electrically contacted. At the same time, a bump 12C having an average maximum bump diameter ($D_{MAX}$) can also be electrically contacted by the peripheral edge 84 but with a minimal amount of bump deformation.

Preferably the width "W1" of the peripheral edge 84 is slightly less than the average minimum bump diameter ($D_{MIN}$). As previously explained, the average minimum bump diameter ($D_{MIN}$) can be an average of all bumps 12C for a particular component 41, determined by statistical analysis.

The length "L1" of the peripheral edge 84 can be equal to, less than, or greater than the width "W1". However, with the length "L1" greater than the width "W1", the contact member 64A is generally elongated or rectangular in shape. This elongated shape permits the bump 12C to deform into the recess 76 without being excessively compacted. In other words, the recess 76 has a shape that allows the bump 12C to be in electrical contact along a first axis (e.g., lateral axis) and at the same time flow along a second orthogonal axis (e.g., longitudinal axis).

A depth "$D_D$" (FIG. 4B) of the recess 76 can be selected to provide a minimal amount of deformation of the bump 12C. Preferably the depth "$D_D$" is substantially less than the average height "H" (FIG. 1B) of the bump 12C. By way of example, the depth "$D_D$" can be from 1% to 75% of the average height "H" (FIG. 1B) of the bump 12C.

The conductive layer 78 covers the sidewalls 82 and bottom surface of the recess 76 and an area on the substrate 72A surrounding the recess 76. In addition, the conductive layer 78 is in electrical communication with an associated conductor 68A formed on the substrate 72A. In FIG. 4A, the conductive layer 78 is generally rectangular in shape with a length "$L_2$" and a width "$W_2$". The length "$L_2$" and width "$W_2$" can be selected to insure that bumps 12C having a maximum diameter ($D_{MAX}$) preferably do not extend past a perimeter of the conductive layer 78.

The conductive layers 78 and conductors 68A can be formed of highly conductive metal such as aluminum, iridium, copper, gold, tungsten, tantalum, molybdenum or alloys of these metals. The conductive layers 78 and conductors 68A can be formed using a suitable metallization process (e.g., deposition, photopatterning, etching). If desired, separate metallization processes can be used for the conductive layers 78 and conductors 68A. In addition, the conductive layers 78 and conductors 68A can be formed as multi-layered stacks of metals (e.g., bonding layer/barrier layer). Still further, the conductors 68A can be electrically insulated with an outer insulating layer (not shown).

The conductive layers 78 can also be formed of a material that is non-reactive with the bumps 12C. For bumps 12C formed of solder, suitable materials for the conductive layers 78 include Be, Mg, Ca, Sr, Ba, Sc, Y, La, Ti, Zr, Hf, V, Nb, Ta, Mo, W, Tc, Re, B, C, Si, Ge and alloys of these materials.

Some of these materials, such as the metals, can be easily plated or metallized in suitable patterns. An exemplary metallization process is disclosed in U.S. Pat. No. 5,607,818, entitled "Method For Making Interconnects And Semiconductor Structures Using Electrophoretic Photoresist Deposition", incorporated herein by reference. Other of the above materials can be deposited as alloys or in combination with other elements. For example, the conductive layers 78 can comprise a metal silicide such as $TiSi_2$, $WSi_2$, $TaSi_2$, $MoSi_2$, $PtSi_2$. In this case, a silicon containing layer and a metal layer can be jointly deposited, or deposited separately, then reacted to form a metal silicide. An exemplary metal silicide deposition process is disclosed in U.S. Pat. No. 5,483,741, entitled "Method For Fabricating A Self Limiting Silicon Based Interconnect For Testing Bare Semiconductor Dice", incorporated herein by reference. Still further, other alloys such as TiN, TiW, TiC and NiB can be deposited using CVD or other deposition process.

The contact members 64A in addition to electrically contacting the bumps 12C, also provide alignment for individual bumps. This alignment function can be used alone or in combination with the alignment member 43 (FIG. 2F) to assemble the carrier 40 with the semiconductor component 41 in alignment with the interconnect 46. In addition, the contact members 64A function to planarize the bumps 12C in the tested component 41. The planarized bumps 12C will have substantially identical heights or z-direction end points.

Referring to FIGS. 5A and 5B, alternate embodiment contact member 64B is illustrated. Contact member 64B is formed substantially as previously described for contact member 64A (FIG. 4A). In particular, the contact member 64B comprises a recess 76B etched into a substrate 72B and covered with a conductive layer 78B. However, the contact member 64B also includes blades 86 configured to penetrate into the bumps 12C. In FIG. 5B, an insulating layer equivalent to insulating layer 80 (FIG. 4B) is omitted for clarity.

The blades 86 can be formed at the same time as the recess 76B using the same etch mask. For the blade pattern shown in FIG. 5A, the etch mask can comprise five squares. Using an anisotropic etch process on a substrate 72B formed of silicon, the recess 76B and blades 86 will have sloped sidewalls substantially as shown in FIGS. 5 and 5A. The height of the blades 86 can be substantially equal to the depth of the recess 76B, or can be less than the depth of the recess 76B. Preferably, the height of the blades 86 is from 5% to 50% of the diameter "D" of the bumps 12C. As shown in FIG. 5B, the blades 86 extend into the recess 76B. However, the blades 86 can be sized to not excessively damage the bumps 12C nor to leave large voids. Voids can trap gases during subsequent processes causing bump deformation and other problems. Still further, the blades allow gases to escape from the area between the contact members 64B and bumps 12C during the test procedure.

In the embodiment illustrated in FIGS. 5 and 5A, there are four blades 86 arranged in a cross (+) pattern. However, other blade numbers and blade patterns are also possible. For example, the blades 86 can be formed in radial patterns or spoke-like patterns. Still further, two or more blades can be formed on either side of the recess 76B rather than on four sides.

Figure 6A:
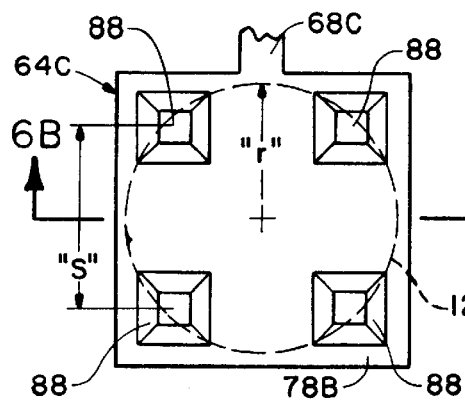
FIG. 6A is an enlarged plan view of an alternate embodiment contact member comprising an array of projections covered with a conductive layer.
Figure 6B:
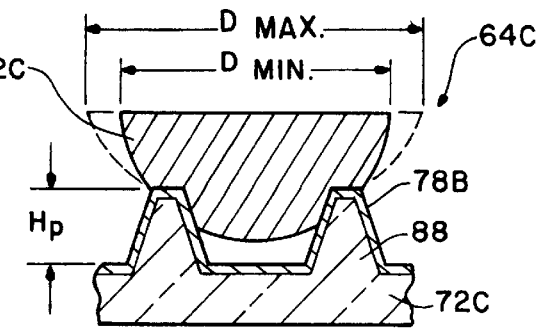
FIG. 6B is a cross sectional view, taken along section line 6B—6B of FIG. 6A.

Referring to FIGS. 6A and 6B, an alternate embodiment contact member 64C is illustrated. Contact member 64C includes four projections 88 arranged in a generally square shaped array configured to retain and electrically contact a single contact bump 12C. In this embodiment, a spacing "s" between the projections 88 is less than a radius "r" of the contact bumps 12C. As is apparent, other configurations wherein one or more projections are arranged in arrays for retaining and electrically contacting contact bumps are also possible (e.g., triangular, pentagonal, octagonal etc.).

Each projection 88 can be formed integrally with the substrate 72C by etching the substrate 72C. With the substrate 72C formed of silicon, an anisotropic etch process can be performed using a mask (not shown) and an etchant such as a solution of KOH and $H_2O$. Using an anisotropic etch process the projections 88 comprise four sided truncated pyramids having sharp edges and angled faces. The edges are adapted to penetrate the contact bumps 12C to break through native oxide layers. The faces have an angle of about 55° with respect to the surface of the substrate 72C. The faces are adapted to provide a wide contact area with the contact bumps 12C.

The conductive layers 78B for the contact members 64C comprise a conductive material formed using a suitable deposition process, such as plating or CVD. The conductive layers 78B can also be formed using a metallization process such a blanket deposition followed by photopatterning and etching.

As shown in FIG. 6B, the conductive layers 78B cover the tips and faces of the projections 88. Alternately, just the faces or other surfaces that electrically contact the bumps 12C can be covered by the conductive layers 78B. As shown in FIG. 6A, the conductive layers 78B can cover areas of the substrate 72C adjacent to the projections 88 in a desired pattern (e.g., square, rectangular, triangular). In addition, the conductive layers 78B can be formed in electrical communication with associated conductors 68C formed on the surface of the substrate 19. If desired, the same deposition process can be used to form both the conductive layers 78B and the conductors 68C. Alternately, the conductive layers 78B and conductors 68C can be formed using separate deposition processes out of different metals. An exemplary thickness for the conductive layers 78B can be from 500 Å to 3 μm or more.

Figure 7A:
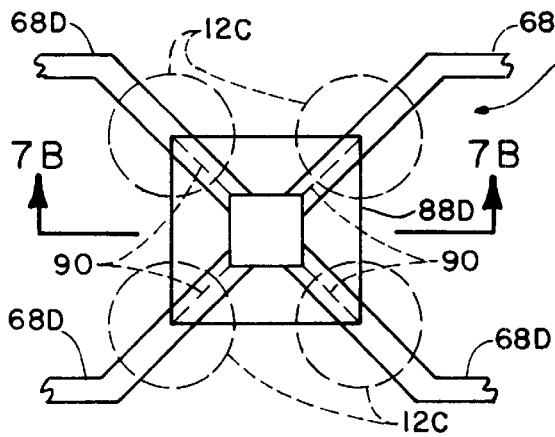
FIG. 7A is an enlarged plan view of an alternate embodiment contact member comprising one projection configured to contact multiple contact bumps.
Figure 7B:
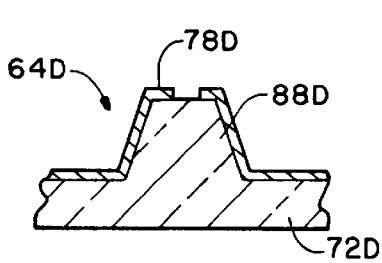
FIG. 7B is a cross sectional view, taken along section line 7B—7B of FIG. 7A.

Referring to FIGS. 7A and 7B, an alternate embodiment contact member 64D is illustrated. The contact member 64D is similar to contact member 64C (FIG. 6A). However, the contact member 64D includes a single projection 88D configured to contact four separate bumps 12C at the same time. In addition, the conductive layer 78D comprises four separate layers formed on the edges 90 (FIG. 7A) of the projection 88D. Each separate conductive layer 78D includes an associated conductor 68D. The contact member 64D in addition to electrically contacting the contact bumps 12C also performs an alignment function of the die 10 or package 17A, 17B with respect to the interconnect 46 (FIG. 3).

Figure 8A:
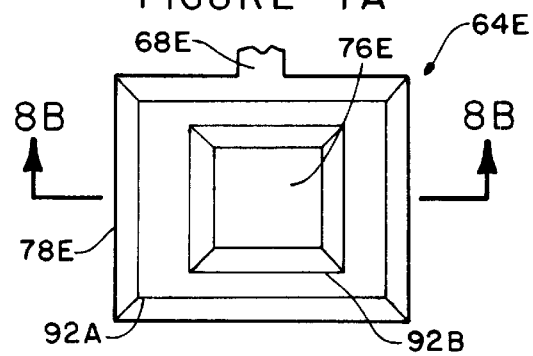
FIG. 8A is an enlarged plan view of an alternate embodiment contact member comprising a stepped recess covered with a conductive layer.
Figure 8B:
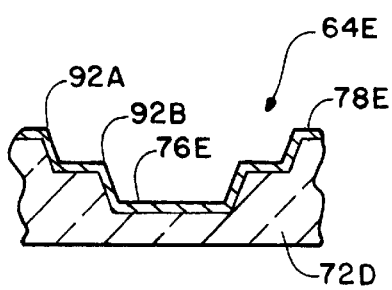
FIG. 8B is a cross sectional view, taken along section line 8B—8B of FIG. 8A.

Referring to FIGS. 8A and 8B, an alternate embodiment contact member 64E is illustrated. Contact member 64E is formed substantially as previously described for contact member 64A (FIG. 4A). However, contact member 64E includes a stepped recess 76E covered with a conductive layer 78E. The stepped recess 76E includes a first peripheral edge 92A and a second peripheral edge 92B. The peripheral edges 92A, 92B function substantially as previously described for peripheral edge 84 (FIG. 4B) but allow a single bump 12C to be penetrated at multiple locations.

Figure 9A:
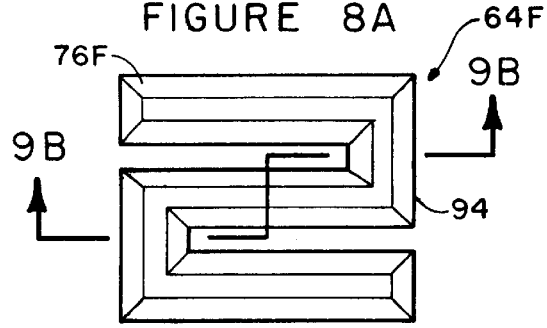
FIG. 9A is an enlarged plan view of an alternate embodiment contact member comprising a serpentine recess covered with a conductive layer.
Figure 9B:
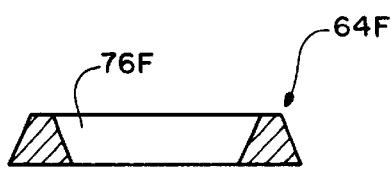
FIG. 9B is a cross sectional view, taken along section lines 9B—9B of FIG. 9A.

Referring to FIGS. 9A and 9B, an alternate embodiment contact member 64F is illustrated. Contact member 64F is formed substantially as previously described for contact member 64A (FIG. 4B) but includes a serpentine recess 76F. The serpentine recess 76F includes a serpentine peripheral edge 94 adapted to penetrate the bumps 12C in a serpentine pattern. In FIG. 9B the conductive layer and conductors are omitted for clarity.

Referring to FIGS. 10A–C, an alternate embodiment contact member 64G includes a single projection 88G and associated conductive layer 78G formed substantially as previously described. The projection 88G is sized and shaped to penetrate the contact bumps 12C to form electrical connections therewith. In addition, as shown in FIG. 10C the projection 88G is adapted to leave a witness mark 91 on the contact bumps 12C. As used herein the term "witness mark" refers to an indentation, scratch or other feature formed on the contact bumps 12C by contact with a particular contact member 64A–I. This configuration of contact member 64G can be used to form a verification contact member as previously described. For orientation verification the contact member 64G can be used to produce a distinctive witness mark 91 on the contact bumps 12C.

Referring to FIGS. 11A–11C, an alternate embodiment contact member 64H includes a conductive pad 93 deposited on a substrate 72H. The conductive pad 93 is in electrical communication with a conductor 68H. In addition the conductive pad 93 includes a circular opening 95 (FIG. 11A) adapted to leave a circular witness mark 91C (FIG. 11C) on the contact bumps 12C.

Referring to FIGS. 12A–12B, an alternate embodiment contact member 64I includes a flat conductive pad 93A formed on a substrate 72I in electrical communication with a conductor 68I. The flat conductive pad 93A can be formed of the materials previously described for the conductive layers 78.

Figure 13:
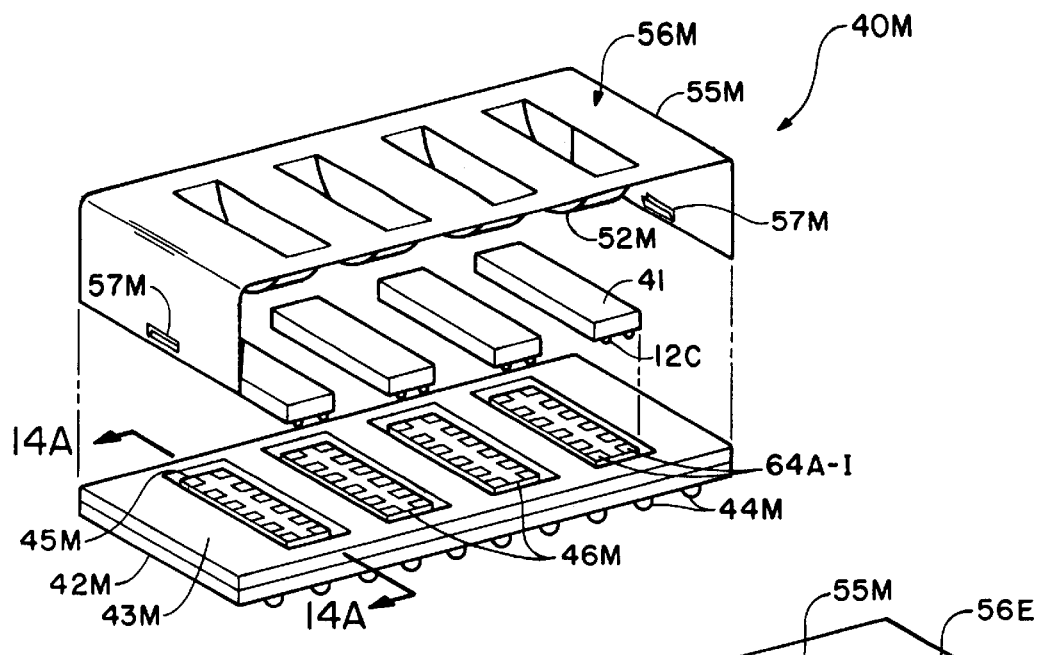
FIG. 13 is a schematic perspective view of an alternate embodiment carrier configured to test multiple semiconductor components.
Figure 13A:
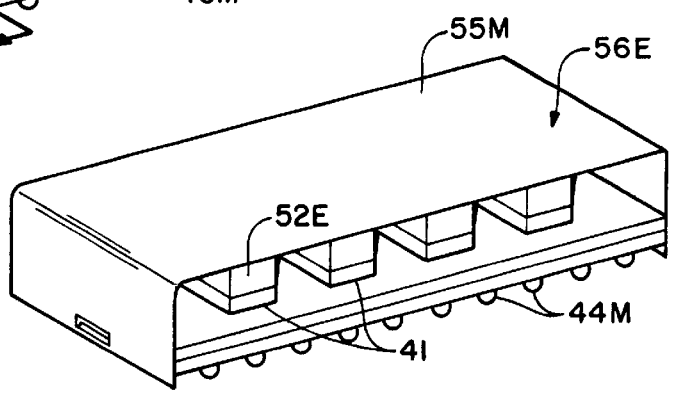
FIG. 13A is a schematic perspective view of an alternate embodiment carrier configured to test multiple semiconductor components and having elastomeric force applying members.

Referring to FIGS. 13 and 13A, an alternate embodiment carrier 40M is adapted to test multiple semiconductor components 41. The carrier 40M includes a base 42M with external contacts 44M and multiple interconnects 46M, each having multiple contact members 64A–I formed substantially as previously described. In addition, the carrier 40M includes multiple interconnects 46M and contact members 64A–I formed substantially as previously described. The carrier 40M also includes a force applying mechanism 56M comprising a bridge clamp 55M with clip portions 57M and leaf springs 52M formed substantially as previously described. Alternately, as shown in FIG. 13A, a force applying mechanism 56E for the carrier 40M can include elastomeric spring members 52E. The elastomeric spring members 52E can be formed of a material such as silicone, butyl rubber, or fluorosilicone; in foam, gel, solid or molded configurations. Suitable elastomeric materials include "PORON" available from Rogers or "BISCO" available from a Dow Chemical subsidiary. If desired, the elastomeric spring members 52E can be secured to the bridge clamp 55M using an adhesive such as silicone. One suitable adhesive is "ZYMET" silicone elastomer manufactured by Zymet, Inc., East Hanover, N.J. Rather than being formed of elastomeric materials, a force applying member equivalent to the elastomeric spring members 52E can be formed as a compressible gas filled bladder. This type of bladder is available from Paratech of Frankfort, Ill. under the trademark "MAXI FORCE AIR BAG".

As shown in FIG. 13, the carrier 40M also includes a coarse alignment member 43M adapted to coarse align the contact bumps 12C on the components 41 to the contact members 64A–I on the interconnects 46M. In the illustrative embodiment, the coarse alignment member 43M comprises a polymer fence formed on the base 42M. One suitable polymer for forming the alignment member 43M comprises a negative tone resist, which is blanket deposited to a desired thickness, exposed, developed and then cured. A suitable resist formulation is sold by Shell Chemical under the trademark "EPON RESIN SU-8". Such a resist can be deposited to a thickness of from about 5–50 mils. A conventional resist coating apparatus, such as a spin coater, can be used to deposit the resist onto the base 42M. The deposited resist can then be "prebaked" at about 95° C. for about 15 minutes and exposed in a desired pattern using a conventional UV aligner with a dose of about 165 mJ/cm². Developing can be accomplished with a solution of PGMEA (propylenglycolmonomethylether-acetate). This can be followed by a hard bake at about 200° C. for about 30 minutes.

Figure 14A:
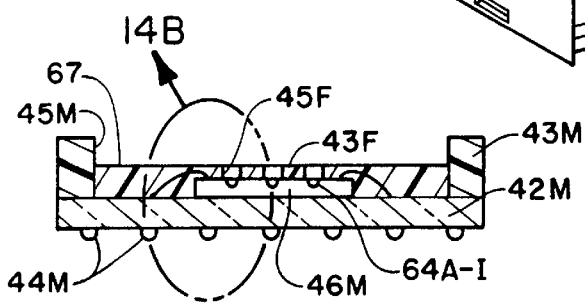
FIG. 14A is a schematic cross sectional view of the alternate embodiment carrier of FIG. 13 taken along section line 14A—14A of FIG. 13.
Figure 14C:
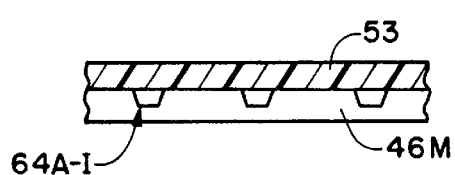
FIGS. 14C and 14D are schematic cross sectional views illustrating formation of an alignment member for the alternate embodiment carrier of FIG. 13.
Figure 14B:
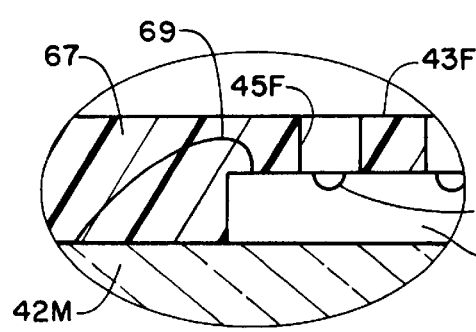
FIG. 14B is an enlarged cross section view of a portion of FIG. 14A taken along section line 14A—14A.

As shown in FIGS. 14A and 14B, the hard baked coarse alignment member 43M include patterns of alignment openings 45M. Each alignment opening 45M is sized and shaped to contact the peripheral edges of a semiconductor component 41, to align the components 41 to the interconnects 46M. This provides coarse alignment of the contact bumps 12C on the components 41 to the contact members 64A–I on the interconnects 46M. As used herein, the term "coarse alignment" refers to a first alignment stage in which a registration between the contact bumps 12C and contact members 64A–I is from about 1 mil to 6 mils.

As also shown in FIGS. 14A and 14B, in addition to the coarse alignment member 43M on the base 42M, a fine alignment member 43F can be formed on the interconnects 46M. The fine alignment member 43F includes alignment openings 45F (FIG. 14B) configured to align individual contact bumps 12C (FIG. 13) on the components 41 to individual contact members 64A–I on the interconnects 46M. As used herein, the term "fine alignment" refers to a second alignment stage in which a registration between the contact bumps 12C and contact members 64A–I is from about 1 mil to 3 mils.

Figure 14D:
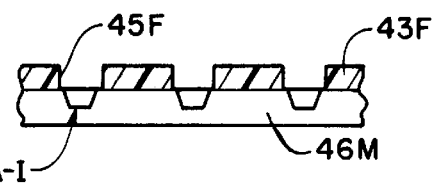

The fine alignment member 43F can comprise a same deposited polymer as the coarse alignment member 43M. As shown in FIG. 14C, to form the fine alignment member 43F, a layer of resist 53 can be deposited on the interconnects 46M as previously described. As shown in FIG. 14D, following patterning and developing, the fine alignment member 43F includes the alignment openings 45F located as required with respect to the contact members 64A–I. The size of the alignment openings 45F is dependent on the sizes of the contact bumps 12C. A representative diameter for the alignment openings 45F for 12 mil diameter contact bumps 12C can be from 13 mils to 15 mils. Preferably the fine alignment member 43F has a thickness that is less than an average height of the contact bumps 12C. This thickness is preferably from about 3 mils to 7 mils.

As shown in FIGS. 14A and 14B, an encapsulant layer 67 can also be deposited on the base 42M to encapsulate bond wires 69 and portions of the interconnects 46M. The bond wires 69 establish electrical communication between the contact members 64A–I on the interconnects 46M, and the external contacts 44M on the base 42M, substantially as previously described. The encapsulant layer 67 can be formed on the base 42M after the coarse alignment member 43M and fine alignment members 43F have been formed. The encapsulant layer 67 can be formed of curable material such as an epoxy, silicone, polyimide or room temperature vulcanizing material. This encapsulant layer 67 can be applied in the manner of a "glob top" using a dispensing nozzle, or can be applied using a spatula tool, and then cured as required.

Referring to FIGS. 15, 16A and 16B, an alternate embodiment carrier 40A is illustrated. The carrier 40A includes a base 42A having internal conductors 58B, and external contacts 44A, that function substantially the same as the equivalent components previously described for carrier 40 (FIG. 2C). The carrier 40A also includes a lid 54A, and an elastomeric spring member 52A, that also function substantially as previously described. In this embodiment, clips 97 secure the lid 54A to the base 42A.

Carrier 40A differs from the previously described carrier 40 (FIG. 2C) in that a flex circuit 50A functions as the interconnect component for making temporary electrical connections to contact bumps 12C on the component 41. The flex circuit 50A is also adapted to make the electrical connection with the internal conductors 58B on the base 42A. This construction reduces parasitics that might occur with wire bonded connections and allows higher test speeds to be employed. In addition, an impedance of the flex circuit 50A can be matched to the impedance of other system components.

As shown in FIG. 16A, the flex circuit 50A comprises a multi-layered tape similar to TAB tape, or "ASMAT" manufactured by Nitto Denko. The flex circuit 50A includes a polymer film 100 and a laminated pattern of conductors 68FC. The conductors 68FC can be formed of a highly conductive metal such as copper. The conductors 68FC function substantially similar to the conductors 68A–F (FIG. 3) for the interconnect 46 (FIG. 3) previously described.

The flex circuit 50A includes contact members 64FC for electrically contacting the contact bumps 12C on the component 41. The contact members 64FC include contact pads 102 formed on the conductors 68FC for electrically contacting the contact bumps 12C. The contact pads 102 can comprise a non-reactive metal such as palladium, gold or platinum plated to the conductors 68FC. Vias 104 (or openings) can be formed in the polymer film 100, using an etching or ablation process, to allow access to the contact pads 102.

As also shown in FIG. 16A, a compressible member 98 can be placed between the flex circuit 50A and the base 42A. The compressible member 98 can comprise an elastomeric material such as silicone, or a gas or liquid filled bladder as previously described. The compressible member 98 functions to generate biasing forces and provide compliancy for making the electrical connections with the contact bumps 12C. An adhesive layer 96 can be formed between the flex circuit 50A and the compressible member 98. The adhesive layer 96 can be a silicone elastomer formed using a suitable deposition or curing process. If desired, the adhesive layer 96 can be eliminated, and the compressible member 98 can be a cured or deposited elastomer selected to perform both biasing and adhesive functions.

As shown in FIG. 16B, bonded connections 66C can be made between the conductors 68FC on the flex circuit 50A and the internal conductors 58B on the base 42A. The bonded connections 66C can comprise solder, or other metal, bonded to the mating surfaces using heat, pressure or ultrasound. The conductors 68FS can include a plated bump, and the internal conductors 58B can include a pad to facilitate formation of the bonded connection 66C. In addition, as will be further described, the flex circuit 50A can include a voltage or ground plane such that an impedance of the conductors 68FC can be matched with other system components such as test circuitry.

Referring to FIG. 16C, an alternate embodiment flex circuit 50B includes microbump contact members 64MB. The contact members 64MB are similar to the previously described contact members 64C (FIG. 6A) having projections 88 (FIG. 6A). The contact members 64MB comprise arrays of microbump projections 110 configured to retain and electrically contact the contact bumps 12C. In the illustrative embodiment, there are three microbump projections 110 per contact member 64MB. However, contact members with fewer or greater microbump projections can be formed (e.g., one to five).

The microbump projections 110 can be formed in vias 112 in a polymer film 100A in electrical communication with patterns of conductors 68FCA laminated to the film 100A. A representative outside diameter for the microbump projections 110 can be from 15–100 $\mu$m depending on the size of the contact bumps 12C. A spacing for the microbump projections 110 will depend on the size of the contact bumps 12C but can be from 3 to 30 mils. The microbump projections 110 can be formed of copper, nickel, gold, palladium or the metals and alloys previously listed for the conductive layers 78 (FIG. 4A). Optionally, a cap layer comprising an inert metal, such as platinum, can be formed on the surface of the microbumps projections 110. A suitable deposition process such as electroplating or evaporation can be used to form the microbump projections 110.

The flex circuit 50B can be attached to the compressible member 98 on the base 42A using an adhesive layer 96A as previously described. In addition, the flex circuit SOB can include a voltage or ground plane 106. The voltage or ground plane 106 comprises a metal layer separated from conductors 68FCA on the film 100A by an insulating layer 108. The voltage or ground plane 106 is located at a predetermined spacing with respect to the conductors 68FCA. This permits an impedance of the conductors 68FCA to be matched to an impedance of other electrical components of a testing system (e.g., testing circuitry).

Test System

Referring to FIG. 17, a test system 114 for testing bumped semiconductor components 41 in accordance with the invention is shown. The system 114 includes a carrier 40 or 40A, 40M, a testing apparatus 116, and testing circuitry 118. The carrier 40, 40A, 40M can be formed as previously described.

The testing apparatus 116 can include a burn-in board, or similar apparatus used for testing conventional plastic or ceramic semiconductor packages. In addition, the testing apparatus 116 can include electrical sockets (e.g., socket 79—FIG. 2J) configured to electrically contact the external contacts on the temporary carriers 40, 40A, 40M. Still further, the temporary carriers 40, 40A, 40M can include a base such as base 42S (FIG. 2I) configured to electrically contact the socket.

For assembling the temporary carriers 40, 40A, 40M optical alignment techniques can be used to optically align the bumps 12C with the contact members 64A–64MB. A suitable method of optical alignment is disclosed in U.S. Pat. No. 5,519,332, entitled "Carrier For Testing An Unpackaged Semiconductor Die", incorporated herein by reference.

Alternately, the temporary carriers 40, 40A, 40M can include alignment members 43 (FIG. 2F) or 43M (FIG. 13) for aligning the bumps 12C and contact members 64A–64MB. As another alternative, the contact members 64A–64MB can be dimensioned to totally perform alignment of the contact bumps 12C upon assembly of the carrier 40, 40A, 40M. Of the different contact member embodiments, contact member 64B (FIG. 5A), contact member 64C (FIG. 6A), and contact member 64D are particularly suited to performing alignment functions. In general, these embodiments provide an alignment function by allowing the bumps 12C to self center within the contact members. The contact members 64A–64MB can also accommodate z-direction variations in the bumps 12C (i.e., planarity of the bumps). Still further, the bumps 12C can be planarized by contact with the contact members 64A–64MB. Using the system 114, test signals can be applied to the semiconductor components 41, to test the integrated circuitry contained thereon.

Thus the invention provides improved temporary carriers and an improved system for testing semiconductor components having contact bumps. The temporary carriers are designed to provide a reliable electrical connection to the contact bumps within a specified size range, and with a minimal application of contact force. In addition, the contact members do not excessively deform the contact bumps or produce large pockets or voids in the contact bumps. Still further, the contact members aid in centering the contact bumps to permit alignment of the component with the interconnect during assembly of the temporary carrier.

While the invention has been described with reference to certain preferred embodiments, as will be apparent to those skilled in the art, certain changes and modifications can be made without departing from the scope of the invention as defined by the following claims.

What is claimed is:

1. A semiconductor carrier comprising:
 a base comprising an external contact, the base configured to retain a semiconductor component comprising a contact bump;
 an interconnect on the base comprising a contact member in electrical communication with the external contact configured to electrically contact the contact bump on the component;
 a first alignment member on the base comprising a first opening configured to contact an edge of the component to coarse align the contact bump to the contact member;
 a second alignment member on the interconnect comprising a second opening configured to contact the contact bump to fine align the contact bump to the contact member; and
 a force applying mechanism attached to the base configured to bias the component against the interconnect.

2. The carrier of claim 1 wherein the component comprises a plurality of contact bumps and the interconnect comprises a plurality of contact members including at least one contact member configured to form a mark on a selected contact bums to indicate an orientation of the component on the base.

3. The carrier of claim 1 the first alignment member provides a first registration between the contact bump and the contact member of about 1 mil to 6 mils.

4. The carrier of claim 1 the second alignment member provides a second registration between the contact bump and the contact member of about 1 mil to 3 mils.

5. The carrier of claim 1 wherein the first alignment member and the second alignment member comprise a patterned layer of resist.

6. The carrier of claim 1 wherein the first opening has a peripheral shape corresponding to a peripheral outline of the component.

7. A semiconductor carrier comprising:
 a base configured to retain a semiconductor component comprising a plurality of contact bumps, the base comprising a plurality of external contacts;
 an interconnect on the base comprising a plurality of contact members configured to electrically contact the contact bumps on the components;
 a plurality of electrical connections on the base electrically connecting the external contacts to the contact members;
 a first alignment member on the base configured to contact an edge of the component to align the component to the interconnect during assembly of the carrier; and
 a second alignment member on the interconnect configured to contact and align the contact bumps to the contact members during assembly of the carrier.

8. The carrier of claim 7 wherein the first alignment member comprises a first opening having a peripheral outline corresponding to a peripheral outline of the component.

9. The carrier of claim 7 wherein the second alignment member comprises a layer of resist patterned and developed with a plurality of alignment openings.

10. The carrier of claim 7 wherein the first alignment member or the second alignment member comprise a curable polymer at least partially encapsulating the electrical connections.

11. A semiconductor carrier for testing a semiconductor component having contact bumps comprising:

a base configured to retain the component and comprising a plurality of external contacts;

an interconnect on the base comprising a plurality of contact members configured to electrically contact the contact bumps;

a plurality of bonded connections electrically connecting the external contacts to the contact members;

a first alignment member on the base configured to contact the component to align the component to the interconnect; and a second alignment member on the interconnect configured to contact the contact bumps to align the contact bumps to the contact members;

the first alignment member and the second alignment member comprising a polymer material at least partially encapsulating at least some of the bonded connections.

12. The carrier of claim 11 wherein the first alignment member provides a coarse alignment of from 1 to 6 mils.

13. The carrier of claim 11 wherein the second alignment member provides a fine alignment of from 1 to 3 mils.

14. A semiconductor carrier for testing a semiconductor component having contact bumps comprising:

a base configured to retain the component and comprising a plurality of external contacts;

a first alignment member on the base configured to align the component to the interconnect during assembly of the carrier, the first alignment member comprising a first opening having a peripheral outline corresponding to a peripheral outline of the component;

an interconnect on the base comprising a plurality of contact members configured to electrically engage the contact bumps on the component;

a second alignment member on the interconnect comprising a plurality of second openings configured to contact and align the contact bumps to the contact members; and a plurality of electrical paths electrically connecting the external contacts on the substrate and the contact members on the interconnect.

15. The carrier of claim 14 wherein a selected contact member comprises a pin one indicator configured to form a distinctive mark on a selected contact bump.

16. The carrier of claim 14 wherein at least one contact member comprises a recess covered with a conductive layer.

17. The carrier of claim 14 wherein at least one contact member comprises a recess with a blade therein.

18. The carrier of claim 14 wherein at least one contact member comprises an array of projections configured to center and electrically engage the contact bumps.

19. The carrier of claim 14 wherein at least one contact member comprises a single projection covered with a plurality of separate conductive layers configured to contact multiple contact bumps.

20. The carrier of claim 14 wherein at least one contact member comprises a stepped edge covered with a conductive layer and including multiple peripheral edges.

21. The carrier of claim 14 wherein at least one contact member comprises a serpentine recess comprising an edge.

22. The carrier of claim 14 wherein at least one contact member comprises a penetrating projection.

23. The carrier of claim 14 wherein at least one contact member comprises a flat pad and an opening therein.

24. A semiconductor carrier for testing a semiconductor component having a plurality of contact bumps comprising:

a base configured to retain the component, the base comprising a plurality of external contacts and a plurality of conductors in electrical communication with the external contacts;

an interconnect on the base comprising a substrate with a plurality of contact members for electrically engaging the contact bumps, each contact member comprising an array of projections covered with a conductive layer in electrical communication with a selected conductor on the base, each contact member configured to electrically engage and center a selected contact bump on the component; and a force applying mechanism for biasing the component against the interconnect.

25. A system for testing semiconductor components comprising:

a testing apparatus in electrical communication with test circuitry;

a carrier for retaining a semiconductor component in electrical communication with the test circuitry, the carrier comprising a base including a plurality of conductors in electrical communication with a plurality of external contacts;

the carrier further comprising an interconnect on the base, the interconnect comprising a substrate with a plurality of contact members configured to electrically contact a plurality of contact bumps on the component;

the carrier further comprising a plurality of electrical paths in electrical communication with the conductors on the base and the contact members on the interconnect;

the carrier further comprising a first alignment member comprising a first opening for engaging an edge of the component for aligning the component to the interconnect, and a second alignment member comprising a plurality of second openings for contacting and aligning the contact bumps to the contact members.

26. The system of claim 25 wherein the second openings have a diameter about 1 to 3 mils greater than a diameter of the contact bumps.

27. The system of claim 25 wherein the first opening has a peripheral outline about 1 to 6 mils greater that a peripheral outline of the component.

28. A system for testing a semiconductor component having contact bumps comprising:

a testing apparatus comprising a socket configured for electrical communication with test circuitry;

a carrier for retaining and placing the component in electrical communication with the socket, the carrier comprising a base including a plurality of conductors in electrical communication with a plurality of external contacts;

the carrier further comprising an interconnect on the base comprising a substrate comprising a plurality of contact members configured to electrically contact the contact bumps on the component, each contact member comprising an array of projections covered with a conductive layer in electrical communication with a selected conductor on the base, each contact member configured to electrically engage and center a selected contact bump on the component;

the carrier further comprising a plurality of electrical paths between the conductors on the base and the contact members on the interconnect.

29. The system of claim 28 wherein the substrate and the projections comprise silicon.

30. The system of claim 29 wherein the socket includes electrical connectors configured to electrically engage the external contacts.

31. The system of claim 30 wherein the carrier further comprises an alignment member for aligning the component to the interconnect.

* * * * *

UNITED STATES PATENT AND TRADEMARK OFFICE
CERTIFICATE OF CORRECTION

PATENT NO : 6,040,702
DATED : March 21, 2000
INVENTOR(S): DAVID R. HEMBREE, WARREN M. FARNWORTH, ALAN G. WOOD
DEREK GOCHNOUR, SALMAN AKRAM It is certified that error appears in the above-identified patent and that said Letters Patent is hereby corrected as shown below:

In claim 2 @ column 18, line 24, change "bums" to —bumps—.

In claim 3 @ column 18, line 27, after "1" add —wherein—.

In claim 4 @ column 18, line 29, after "1" add —wherein—.

In claim 7 @ column 18, line 45, change "components" to —component—.

Signed and Sealed this

Twentieth Day of February, 2001

Attest:

NICHOLAS P. GODICI

*Attesting Officer*     Acting Director of the United States Patent and Trademark Office